US012796020B2

(12) United States Patent
Jung et al.

(10) Patent No.: US 12,796,020 B2
(45) Date of Patent: Nov. 10, 2026

(54) INTEGRATED CIRCUIT DEVICE

(71) Applicant: SAMSUNG ELECTRONICS CO., LTD., Suwon-si (KR)

(72) Inventors: Jooho Jung, Suwon-si (KR); Junggil Yang, Suwon-si (KR); Deokhwan Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 649 days.

(21) Appl. No.: 18/224,745

(22) Filed: Jul. 21, 2023

(65) Prior Publication Data

US 2024/0030283 A1 Jan. 25, 2024

(30) Foreign Application Priority Data

Jul. 25, 2022 (KR) ........................ 10-2022-0092043

(51) Int. Cl.

*H10D 62/10* (2025.01)
*H10D 30/43* (2025.01)
(Continued)

(52) U.S. Cl.

CPC ........... *H10D 62/115* (2025.01); *H10D 30/43* (2025.01); *H10D 30/6735* (2025.01);
(Continued)

(58) Field of Classification Search

CPC .. H10D 62/115; H10D 84/85; H10D 30/6757; H10D 62/121; H10D 64/017; H10D 30/6735; H10D 30/43
(Continued)

(56) References Cited

U.S. PATENT DOCUMENTS

| | | | |
|---|---|---|---|
| 7,002,207 | B2 | 2/2006 | Kim et al. |
| 7,282,444 | B2 | 10/2007 | Tanida et al. |

(Continued)

FOREIGN PATENT DOCUMENTS

| | | |
|---|---|---|
| CN | 113964037 | 1/2022 |
| CN | 114256230 | 3/2022 |

(Continued)

OTHER PUBLICATIONS

S. Natarajan, et al., "A 14nm SoC Platform Technology Featuring 2nd Generation Tri-Gate Transistors, 70 nm Gate Pitch, 52 nm Metal Pitch, and 0.0499 um2 SRAM cells, Optimized for Low Power, High Performance and High Density SoC Products," IEEE VLSI 2015.

(Continued)

*Primary Examiner* — Jami Valentine Miller
(74) *Attorney, Agent, or Firm* — Morgan, Lewis & Bockius LLP

(57) ABSTRACT

An integrated circuit device includes: a fin-type active region protruding from a substrate and extending in a first lateral direction, wherein the fin-type active region includes a first sub-fin-type active region, a second sub-fin-type active region, and a third sub-fin-type active region that is disposed between the first sub-fin-type active region and the second sub-fin-type active region; a first gate line extending in a second lateral direction on the first sub-fin-type active region, wherein the second lateral direction intersects with the first lateral direction; a second gate line extending in the second lateral direction on the second sub-fin-type active region; a diffusion break structure passing through a portion of the third sub-fin-type active region in a vertical direction, wherein the diffusion break structure has a groove portion in an upper portion thereof; and a crack filler filling the groove portion.

20 Claims, 20 Drawing Sheets

(51) Int. Cl.

| | |
|---|---|
| ***H10D 30/67*** | (2025.01) |
| ***H10D 64/01*** | (2025.01) |
| ***H10D 84/85*** | (2025.01) |

(52) U.S. Cl.
CPC ....... *H10D 30/6757* (2025.01); *H10D 62/121* (2025.01); *H10D 64/017* (2025.01); *H10D 84/85* (2025.01)

(58) Field of Classification Search
USPC ........................................................... 257/288
See application file for complete search history.

(56) References Cited

U.S. PATENT DOCUMENTS

| | | | | |
|---|---|---|---|---|
| 8,106,475 | B2 | 1/2012 | Kitamura et al. | |
| 9,589,845 | B1 * | 3/2017 | Jagannathan ...... | H10D 84/0158 |
| 10,014,296 | B1 * | 7/2018 | Dou ..................... | H10D 84/834 |
| 10,665,669 | B1 * | 5/2020 | Xie .................... | H10D 30/6735 |
| 2015/0372104 | A1 | 12/2015 | Liu et al. | |
| 2017/0194436 | A1 * | 7/2017 | Basker ................... | H10D 30/62 |
| 2020/0051976 | A1 * | 2/2020 | Ha ....................... | H10D 64/017 |
| 2020/0058652 | A1 * | 2/2020 | Park ................... | H10D 30/6211 |
| 2021/0343597 | A1 | 11/2021 | Ko et al. | |
| 2022/0302172 | A1 * | 9/2022 | Hong ................. | H10D 30/6735 |

FOREIGN PATENT DOCUMENTS

| | | |
|---|---|---|
| JP | 2005-167093 | 6/2005 |
| KR | 10-0481209 | 3/2005 |
| KR | 10-2006-0076587 | 7/2006 |
| KR | 10-2009-0103003 | 10/2009 |
| KR | 10-2019-0118820 A | 10/2019 |

OTHER PUBLICATIONS

1st Office Action issued Oct. 12, 2025 in corresponding Korean Patent Application No. 10-2022-0092043, with 1 English machine translation.

* cited by examiner

INTEGRATED CIRCUIT DEVICE

CROSS-REFERENCE TO RELATED APPLICATION

This application claims priority under 35 U.S.C. § 119 to Korean Patent Application No. 10-2022-0092043, filed on Jul. 25, 2022, in the Korean Intellectual Property Office, the disclosure of which is incorporated by reference herein in its entirety.

TECHNICAL FIELD

The present inventive concept relates to an integrated circuit (IC) device, and more particularly, to an IC device including a field-effect transistor (FET).

DISCUSSION OF THE RELATED ART

As electronic products are desired to be miniaturized, multifunctional, and highly efficient, semiconductor packages are also desired to become highly integrated and operate at a relatively high speed. To this end, a semiconductor package including a plurality of semiconductor chips including stacked semiconductor chips has been under development.

SUMMARY

The present inventive concept provides an integrated circuit (IC) device with increased reliability.

According to an embodiment of the present inventive concept, an integrated circuit device includes: a fin-type active region protruding from a substrate and extending in a first lateral direction, wherein the fin-type active region includes a first sub-fin-type active region, a second sub-fin-type active region, and a third sub-fin-type active region that is disposed between the first sub-fin-type active region and the second sub-fin-type active region; a first gate line extending in a second lateral direction on the first sub-fin-type active region, wherein the second lateral direction intersects with the first lateral direction; a second gate line extending in the second lateral direction on the second sub-fin-type active region; a diffusion break structure passing through a portion of the third sub-fin-type active region in a vertical direction, wherein the diffusion break structure has a groove portion in an upper portion thereof; and a crack filler filling the groove portion.

According to an embodiment of the present inventive concept, an integrated circuit device includes: a substrate including a first isolation region and a second isolation region; a fin-type active region protruding from a substrate, wherein the fin-type active region includes a first sub-fin-type active region, a second sub-fin-type active region, and a third sub-fin-type active region, wherein the first sub-fin type active region extends in a first lateral direction in the first isolation region, wherein the second sub-fin-type active region extends in the first lateral direction in the second isolation region, and wherein the third sub-fin-type active region is disposed between the first sub-fin-type active region and the second sub-fin-type active region; a first gate line extending in a second lateral direction on the first sub-fin-type active region, wherein the second lateral direction intersects with the first lateral direction; a second gate line extending in the second lateral direction on the second sub-fin-type active region; a diffusion break structure passing through a portion of the third sub-fin-type active region in a vertical direction between the first isolation region and the second isolation region; and a crack filler partially extending from a top surface of the diffusion break structure into the diffusion break structure.

According to an embodiment of the present inventive concept, an integrated circuit device includes: a substrate including a first device isolation region and a second device isolation region, wherein the first device region includes a first isolation region and a second isolation region; an inter-region insulating pattern extending in a first lateral direction between the first device region and the second device region; a first sub-fin-type active region extending in the first lateral direction in the first isolation region; a second sub-fin-type active region extending in the first lateral direction in the second isolation region; a third sub-fin-type active region disposed between the first isolation region and the second isolation region; a first gate line extending in a second lateral direction in the first sub-fin-type active region, wherein the second lateral direction intersects the first lateral direction; a second gate line extending in the second lateral direction in the second sub-fin-type active region; a diffusion break structure partially passing through the third sub-fin-type active region, wherein the diffusion break structure has a groove portion, wherein the groove portion partially passes through a top surface of the diffusion break structure in a vertical direction; a first nanosheet stack disposed on the first sub-fin-type active region, wherein the first nanosheet stack is at least partially surrounded by the first gate line; a second nanosheet stack disposed on the second sub-fin-type active region, wherein the second nanosheet stack is at least partially surrounded by the second gate line; a dummy nanosheet stack disposed on the third sub-fin-type active region, wherein the dummy nanosheet stack partially covers a sidewall of the diffusion break structure; and a crack filler filling the groove portion of the diffusion break structure.

BRIEF DESCRIPTION OF THE DRAWINGS

The above and other aspects of the present inventive concept will become more apparent by describing in detail embodiments thereof, with reference to the accompanying drawings, in which.

DETAILED DESCRIPTION OF THE EMBODIMENTS

Figure 1:
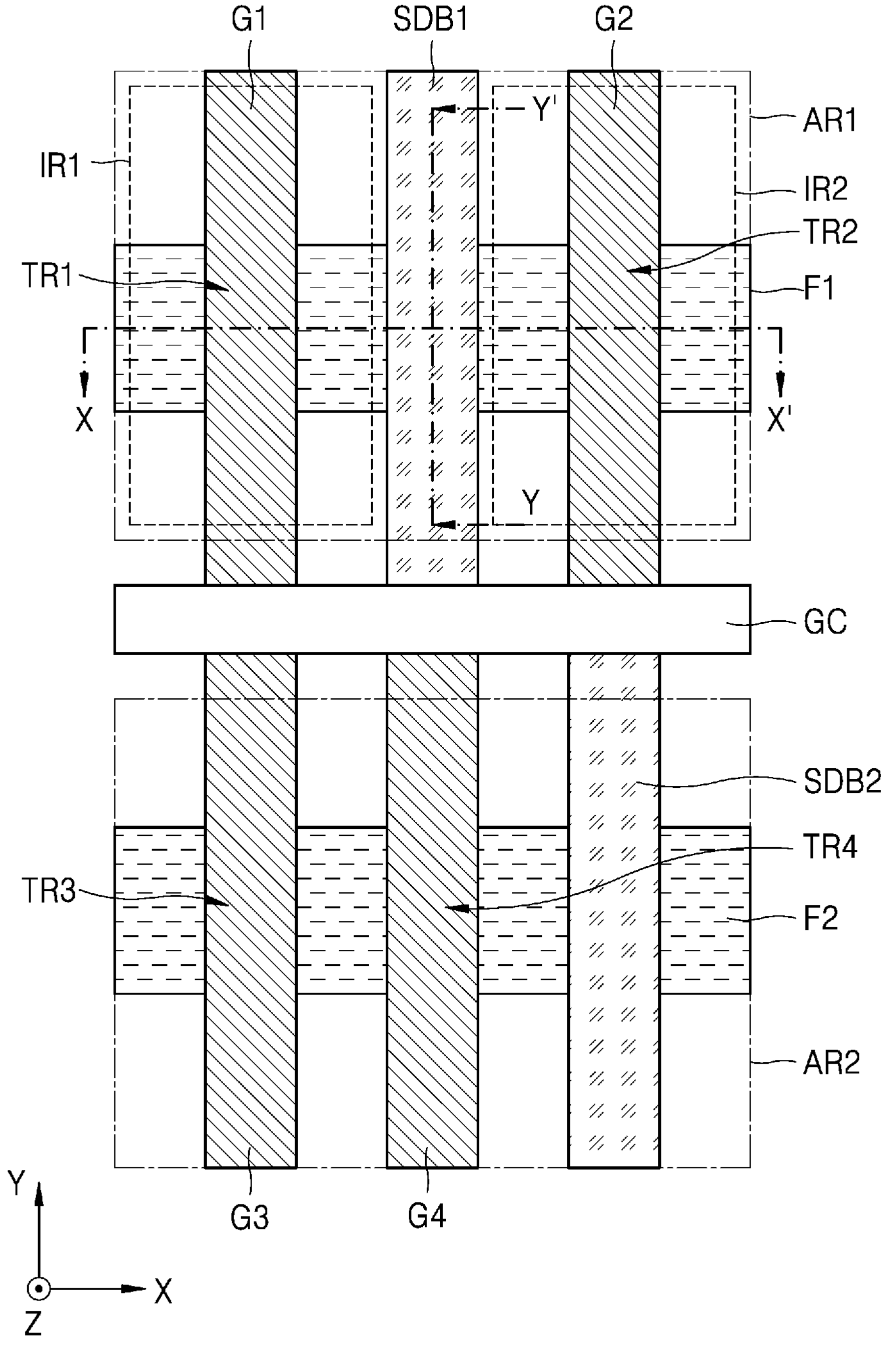
FIG. 1 is a layout diagram of an integrated circuit (IC) device according to an embodiment of the present inventive concept.

Hereinafter, embodiments of the present inventive concept will be described in detail with reference to the accompanying drawings. The same reference numerals are used to denote the same elements in the drawings, and repeated descriptions thereof may be omitted or briefly discussed.

Figure 2:
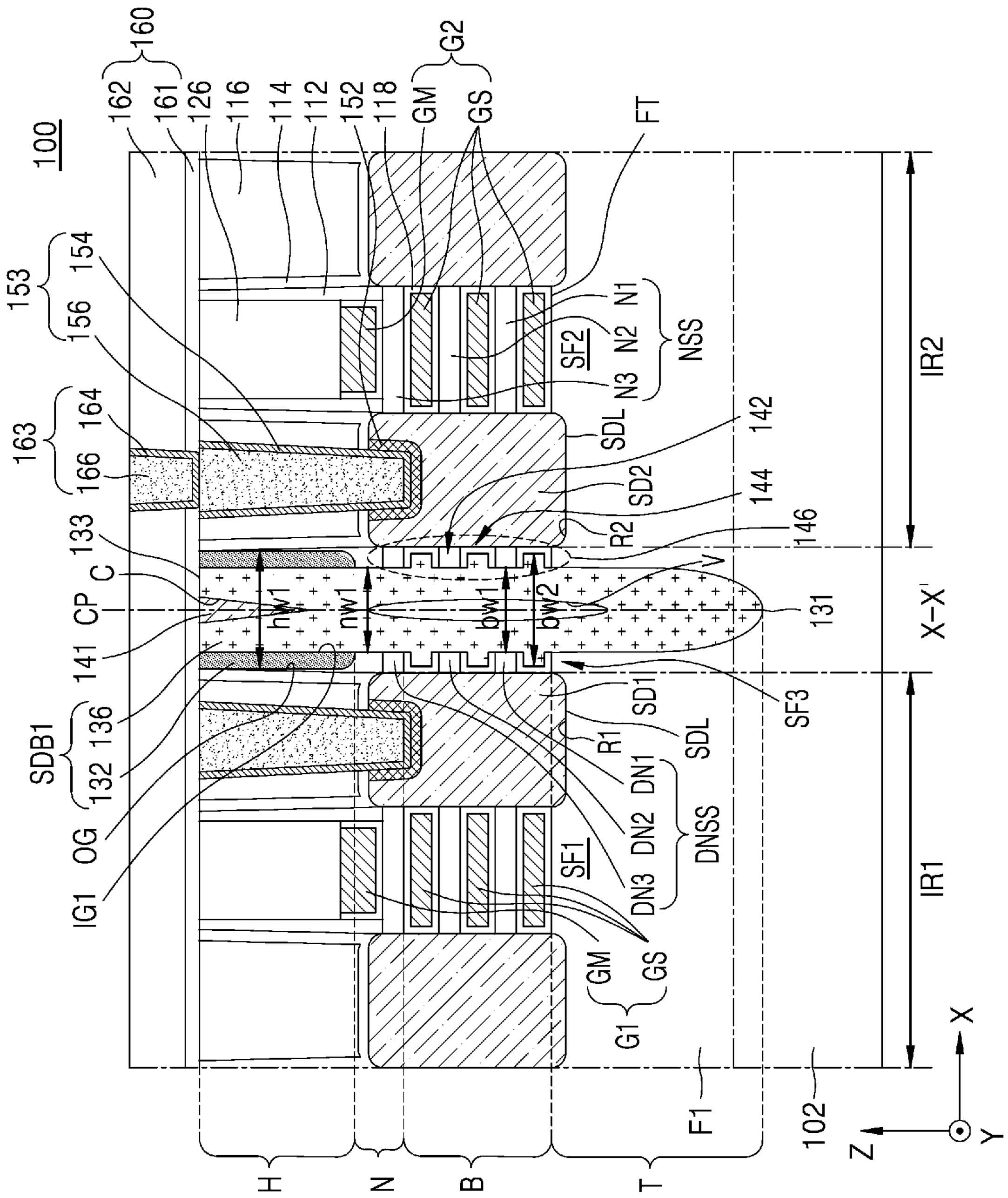
FIG. 2 shows cross-sectional views taken along lines X-X' and Y-Y' of FIG. 1.

FIG. 1 is a layout diagram of an integrated circuit (IC) device 100 according to an embodiment of the present inventive concept. FIG. 2 shows cross-sectional views taken along lines X-X' and Y-Y' of FIG. 1.

Referring to FIGS. 1 and 2, the IC device 100 may include a substrate 102 including a first device region AR1 and a second device region AR2 and a plurality of fin-type active regions (e.g., F1 and F2), which protrude from the first device region AR1 and the second device region AR2 of the substrate 102 in a vertical direction (e.g., a Z direction).

According to an embodiment of the present inventive concept, the substrate 102 may include a semiconductor (e.g., silicon (Si) and germanium (Ge)) or a compound semiconductor (e.g., silicon germanium (SiGe), silicon carbide (SiC), gallium arsenide (GaAs), indium arsenide (InAs), indium gallium arsenide (InGaAs), and indium phosphide (InP)). As used herein, each of the terms "SiGe," "SiC," "GaAs," "InAs," "InGaAs," and "InP" refers to a material including elements included therein, without referring to a chemical formula representing a stoichiometric relationship. For example, the substrate 102 may include a conductive region, for example, a doped well or a doped structure.

According to an embodiment of the present inventive concept, the plurality of fin-type active regions (e.g., F1 and F2) may extend parallel to each other in a first lateral direction (e.g., a X direction). For example, the plurality of fin-type active regions (e.g., F1 and F2) may include a first fin-type active region F1 and a second fin-type active region F2. The first fin-type active region F1 may protrude from the first device region AR1 of the substrate 102 in a vertical direction. The second fin-type active region F2 may protrude from the second device region AR2 of the substrate 102 in the vertical direction. Although FIG. 1 illustrates an example in which the first device region AR1 includes one first fin-type active region F1 and the second device region AR2 includes one second fin-type active region F2, each of the first device region AR1 and the second device region AR2 may include a plurality of fin-type active regions.

According to an embodiment of the present inventive concept, a device isolation film (see 106 in FIG. 6A) may be disposed on the substrate 102 to cover both sidewalls of each of the first and second fin-type active regions F1 and F2. The device isolation film 106 may include, for example, an oxide film, a nitride film, or a combination thereof. Each of the plurality of fin-type active regions (e.g., F1 and F2) may have a fin shape protruding from a top surface of the device isolation film 106 in the vertical direction.

According to an embodiment of the present inventive concept, on the plurality of fin-type active regions F1 and F2, a plurality of gate lines (e.g., first to fourth gate lines G1, G2, G3, and G4) may extend in a second lateral direction (e.g., a Y direction), which intersects with the first lateral direction (e.g., the X direction). For example, the first gate line G1 and the second gate line G2 may extend in the second lateral direction (e.g., the Y direction) on the first fin-type active region F1, and the third gate line G3 and the fourth gate line G4 may extend in the second lateral direction (e.g., the Y direction) on the second fin-type active region F2.

According to an embodiment of the present inventive concept, an inter-region insulating pattern GC may be at a boundary between the first device region AR1 and the second device region AR2. According to an embodiment of the present inventive concept, the inter-region insulating pattern GC may be on the device isolation film 106.

According to an embodiment of the present inventive concept, on the first and second fin-type active regions F1 and F2, a plurality of diffusion break structures (e.g., SDB1 and SDB2) may extend in the second lateral direction (e.g., the Y direction), which intersects with the first lateral direction (e.g., the X direction). For example, a first diffusion break structure SDB1 may extend in the second lateral direction (e.g., the Y direction) on the first fin-type active region F1, and a second diffusion break structure SDB2 may extend in the second lateral direction (e.g., the Y direction) on the second fin-type active region F2.

In an embodiment of the present inventive concept, the first diffusion break structure SDB1 may be in a substantially straight line with the third gate line G3, the fourth gate line G4, or the second diffusion break structure SDB2 of the second device region AR2 with the inter-region insulating pattern GC therebetween. For example, the inter-region insulating pattern GC may be disposed between the third gate line G3, the fourth gate line G4, and the second diffusion break structure SDB2 and the first diffusion break structure SDB1. Although the first diffusion break structure SDB1 and the second diffusion break structure SDB2 are illustrated as being in a straight line in FIG. 1, the first diffusion break structure SDB1 and the second diffusion break structure SDB2 may be in a substantially straight line with the inter-region insulating pattern GC therebetween.

According to an embodiment of the present inventive concept, the first and second diffusion break structures SDB1 and SDB2, and the inter-region insulating pattern GC may include a nitrogen-containing insulating film. For example, the first and second diffusion break structures SDB1 and SDB2 and the inter-region insulating pattern GC may include a silicon nitride film.

According to an embodiment of the present inventive concept, the first device region AR1 may include a first isolation region IR1 and a second isolation region IR2. According to an embodiment of the present inventive concept, the first fin-type active region F1 may include a first sub-fin-type active region SF1, a second sub-fin-type active region SF2, and a third sub-fin-type active region SF3 disposed between the first sub-fin-type active region SF1 and the second sub-fin-type active region SF2.

According to an embodiment of the present inventive concept, the first sub-fin-type active region SF1 may be disposed in the first isolation region IR1, and the second sub-fin-type active region SF2 may be disposed in the second isolation region IR2. According to an embodiment of the present inventive concept, the third sub-fin-type active region SF3 may be at a boundary between the first isolation region IR1 and the second isolation region IR2. According to an embodiment of the present inventive concept, the first diffusion break structure SDB1 may be at a boundary between the first isolation region IR1 and the second isolation region IR2 and may be disposed on the third fin-type active region SF3.

According to an embodiment of the present inventive concept, in the first device region AR1, a plurality of recesses (e.g., R1 and R2) may be formed in the first fin-type active region F1. For example, a plurality of first recesses R1 may be formed adjacent to the first sub-fin-type active region SF1 in the first isolation region IR1, and a plurality of second recesses R2 may be formed adjacent to the second sub-fin-type active region SF2 in the second isolation region IR2.

According to an embodiment of the present inventive concept, a plurality of first source/drain regions SD1 may be formed inside the plurality of first recesses R1 in the first isolation region IR1, and a plurality of second source/drain regions SD2 may be formed inside the plurality of second recesses R2 in the second isolation region IR2.

FIG. 2 illustrates an example in which a lowermost surface of each of the plurality of first recesses R1 and the plurality of second recesses R2 is at a level lower than fin top surfaces FT of the first and second fin-type active regions F1 and F2, but the present inventive concept is not limited thereto. For example, in an embodiment of the present inventive concept, the lowermost surface of each of the plurality of first recesses R1 and the plurality of second recesses R2 may be substantially at the same level as the fin top surfaces FT of the first and second fin-type active regions F1 and F2.

According to an embodiment of the present inventive concept, a plurality of recesses may be formed adjacent to the second fin-type active region F2 in the second device region AR2. For example, in the second device region AR2, a plurality of source/drain regions may be formed inside the plurality of recesses. The plurality of recesses and the plurality of source/drain regions, which are formed adjacent to the second fin-type active region F2, may have similar structures to those of the plurality of first and second recesses R1 and R2 and the plurality of first and second source/drain regions SD1 and SD2 in the first device region A.

According to an embodiment of the present inventive concept, a plurality of nanosheet stacks NSS may be respectively disposed on the fin top surfaces FT of the first and second fin-type active regions F1 and F2 in regions where the first and second fin-type active regions F1 and F2 intersect with the first to fourth gate lines G1, G2, G3, and G4.

According to an embodiment of the present inventive concept, the plurality of nanosheet stacks NSS may also be respectively disposed in regions where the first and second fin-type active regions F1 and F2 overlap the first and second diffusion break structures SDB1 and SDB2. The nanosheet stacks NSS disposed in the regions where the first and second fin-type active regions F1 and F2 overlap the first and second diffusion break structures SDB1 and SDB2 may be at substantially the same vertical level as that of the nanosheet stacks NSS in the regions where the first and second fin-type active regions F1 and F2 intersect with the first to fourth gate lines G1, G2, G3, and G4.

For example, the plurality of nanosheet stacks NSS may be apart from the first and second fin-type active regions F1 and F2 in the vertical direction (e.g., the Z direction) and face the fin top surfaces FT of the first and second fin-type active regions F1 and F2. As used herein, the term "nanosheet" refers to a conductive structure having cross-section that is substantially perpendicular to a direction in which current flows. The nanosheet should be interpreted as including a nanowire.

The number of nanosheet stacks NSS, the number of gate lines, and the number of diffusion break structures on one fin-type active region F1 or F2 are not specifically limited.

According to an embodiment of the present inventive concept, each of the plurality of nanosheet stacks NSS may include a plurality of nanosheets (e.g., N1, N2, and N3), which overlap each other in the vertical direction (e.g., a Z direction) on the fin top surface FT of each of the first and second fin-type active regions F1 and F2. Each of the plurality of nanosheets (e.g., N1, N2, and N3) may be at different vertical distances (e.g., Z-directional distances) from the fin top surface FT. The plurality of nanosheets (e.g., N1, N2, and N3) may include a first nanosheet N1, a second nanosheet N2, and a third nanosheet N3, which are sequentially stacked on the fin top surface FT of each of the first and second fin-type active regions F1 and F2.

Each of the plurality of nanosheet stacks NSS is illustrated as including three nanosheets (e.g., N1, N2, and N3) in FIG. 2, but the present inventive concept is not limited thereto. The number of nanosheets included in the nanosheet stack NSS is not specifically limited. In an embodiment of the present inventive concept, the first to third nanosheets N1, N2, and N3 may have substantially the same thickness as each other in the vertical direction (e.g., the Z direction). In an embodiment of the present inventive concept, at least some of the first to third nanosheets N1, N2, and N3 may have different thicknesses from each other in the vertical direction (e.g., the Z direction).

In an embodiment of the present inventive concept, the first to third nanosheets N1, N2, and N3 in one nanosheet stack NSS may have the same size as each other in the first lateral direction (e.g., X direction). In an embodiment of the present inventive concept, at least some of the first to third nanosheets N1, N2, and N3 in one nanosheet stack NSS may have different sizes in the first lateral direction (e.g., the X direction). For example, each of the first and second nanosheets N1 and N2, which are relatively close to the fin top surface FT in the first lateral direction (e.g., X direction), from among the first to third nanosheets N1, N2, and N3, may have a smaller length than the third nanosheet N3, which is farthest from the fin top surface FT, among the first to third nanosheets N1, N2 and N3.

According to an embodiment of the present inventive concept, the first to fourth gate lines G1, G2, G3, and G4 may surround each of the first to third nanosheets N1, N2, and N3 while covering the plurality of nanosheet stacks NSS. According to an embodiment of the present inventive concept, a plurality of transistors (e.g., first to fourth transistors TR1, TR2, TR3, and TR4) may be formed in portions where the first and second fin-type active regions F1 and F2 intersect the first to fourth gate lines G1, G2, G3, and G4.

According to an embodiment of the present inventive concept, the first and second transistors TR1 and TR2 of the first device region AR1 may be of the same conductivity type as each other, and the third and fourth transistors TR3 and TR4 of the second device region AR2 may be of the same conductivity type as each other. According to an embodiment of the present inventive concept, the first and second transistors TR1 and TR2 of the first device region AR1 may be of a conductivity type different from that of the third and fourth transistors TR3 and TR4 of the second device region AR2.

According to an embodiment of the present inventive concept, the first device region AR1 may be an NMOS transistor region, and the second device region AR2 may be a PMOS transistor region. For example, in the first device region AR1, a plurality of NMOS transistors (e.g., the first and second transistors TR1 and TR2) may be formed at portions where the first fin-type active region F1 intersect with the first gate line G1 and the second gate line G2. For example, in the second device region AR2, a plurality of PMOS transistors (e.g., the third and fourth transistors TR3 and TR4) may be formed at portions where the second fin-type active region F2 intersect with the third gate line G3 and the fourth gate line G4.

For example, in the first device region AR1, the first transistor TR1 may be formed at the portion where the first sub-fin-type active region SF1 intersects with the first gate line G1, and the second transistor TR2 may be formed at the portion where the second sub-fin-type active region SF2 intersects with the second gate line G2.

According to an embodiment of the present inventive concept, in the first device region AR1, the plurality of first source/drain regions SD1 and the plurality of second source/drain regions SD2 may include a Si layer doped with an n-type dopant or a SiC layer doped with an n-type dopant. According to an embodiment of the present inventive concept, in the second device region AR2, the plurality of source/drain regions may include a SiGe layer doped with a p-type dopant. For example, the n-type dopant may include at least one of phosphorus (P), arsenic (As), and/or antimony (Sb). For example, the p-type dopant may include at least one of boron (B) and/or gallium (Ga).

According to an embodiment of the present inventive concept, the first and second diffusion break structures SDB1 and SDB2 may fill spaces between the first to third nanosheets N1, N2, and N3 while passing through the plurality of nanosheet stacks NSS. In this case, a plurality of dummy nanosheet stacks DNSS may be formed to cover sidewalls of the first and second diffusion break structures SDB1 and SDB2. According to an embodiment of the present inventive concept, the sidewalls of the first and second diffusion break structures SDB1 and SDB2 may be at least partially covered by a plurality of dummy nanosheets (e.g., DN1, DN2, and DN3).

Structures of the first fin-type active region F1, the first gate line G1, the second gate line G2, and the first diffusion break structure SDB1 in the first device region AR1 may be respectively substantially the same as structures of the second fin-type active region F2, the third gate line G3, the second gate line G2, and the second diffusion break structure SDB2 in the second device region AR2 except that the first diffusion break structure SDB1 is disposed between the first gate line G1 and the second gate line G2.

Hereinafter, of the IC device 100, the first fin-type active region F1, the first gate line G1, the second gate line G2, and the first diffusion break structure SDB1 of the first device region AR1 will be described.

According to an embodiment of the present inventive concept, in the first isolation region IR1 and the second isolation region IR2, each of the first gate line G1 and the second gate line G2 may include a main gate portion GM and a plurality of sub-gate portions GS. The main gate portion GM may extend in the second lateral direction (e.g., Y direction) while covering a top surface of the nanosheet stack NSS. The plurality of sub-gate portions GS may be integrally connected to the main gate portion GM and respectively one-by-one between the first to third nanosheets N1, N2, and N3. For example, the plurality of sub-gate portions GS and the first to third nanosheets N1, N2, and N3 may alternately arranged in the vertical direction (e.g., the Z-direction). In addition, the plurality of sub-gate portions GS may be between the first and second fin-type active regions F1 and F2 and the first nanosheet N1.

Each of the first gate line G1 and the second gate line G2 may include a metal, a metal nitride, a metal carbide, or a combination thereof. The metal may be at least one of, for example, titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and/or palladium (Pd). The metal nitride may be at least one of, for example, titanium nitride (TiN) and/or tantalum nitride (TaN). The metal carbide may be titanium aluminum carbide (TiAlC).

According to an embodiment of the present inventive concept, a gate dielectric film 118 may be between the first and second gate lines G1 and G2 and the first to third nanosheets N1, N2, and N3 in the nanosheet stack NSS. According to an embodiment of the present inventive concept, the gate dielectric film 118 may include portions covering a surface of each of the first to third nanosheets N1, N2, and N3, portions covering sidewalls of the main gate portion GM, and portions covering sidewalls of the sub-gate portion GS.

According to an embodiment of the present inventive concept, the gate dielectric film 118 may be disposed between the first to third nanosheets N1, N2, and N3 and may be disposed between the first fin-type active region F1 and the first nanosheet N1. In addition, both sidewalls (e.g., opposing vertical extending sidewalls) of each of the plurality of sub-gate portions GS may be spaced apart from the first and second source/drain regions SD1 and SD2 by the gate dielectric film 118 that is disposed therebetween. According to an embodiment of the present inventive concept, the gate dielectric film 118 may include a portion in contact with the first and second source/drain regions SD1 and SD2. The first and second source/drain regions SD1 and SD2 may face the nanosheet stack NSS and the plurality of sub-gate portions GS in the first lateral direction (e.g., the X direction).

According to an embodiment of the present inventive concept, the gate dielectric film 118 may also be disposed between the plurality of dummy nanosheets (e.g., DN1, DN2, and DN3) in the dummy nanosheet stack DNSS. According to an embodiment of the present inventive concept, portions of the first diffusion break structure SDB1, which fill spaces between the plurality of dummy nanosheets (e.g., DN1, DN2, DN3), may be spaced apart from the first to third dummy nanosheets DN1, DN2, and DN3 and the first and second source/drain regions SD1, SD2 by the gate dielectric film 118 that is disposed therebetween.

According to an embodiment of the present inventive concept, the gate dielectric film 118 may have a stack structure of an interface film and a high-k dielectric film. The interface film may include a low-k dielectric material film having a low dielectric constant of about 9, for example, a silicon oxide film, a silicon oxynitride film, or a combination thereof. In an embodiment of the present inventive concept, the interface film may be omitted. The high-k dielectric film may include a material having a dielectric constant higher than that of a silicon oxide film. For example, the high-k dielectric film may have a dielectric constant of about 10 to about 25. The high-k dielectric film may include hafnium oxide, but the present inventive concept is not limited thereto.

In an embodiment of the present inventive concept, the first to third nanosheets N1, N2, and N3 may include semiconductor layers including the same element as each other. For example, each of the first to third nanosheets N1, N2, and N3 may include a Si layer. In the first device region AR1, the first to third nanosheets N1, N2, and N3 may be doped with a dopant of the same conductivity type as that of the first and second source/drain regions SD1 and SD2. In the second device region AR2, the plurality of nanosheets may be doped with a dopant of the same conductivity type as that of the plurality of source/drain regions. For example, the first to third nanosheets N1, N2, and N3 may include a Si layer doped with an n-type dopant in the first device region AR1, and the plurality of nanosheets may include a Si layer doped with a p-type dopant in the second device region AR2.

According to an embodiment of the present inventive concept, in the first isolation region IR1 and the second isolation region IR2, sidewalls of the first gate line G1 and the second gate line G2 may be covered by a plurality of outer insulating spacers 112. The plurality of outer insulating spacers 112 may cover both sidewalls of the main gate portion GM on the top surface of each of the plurality of nanosheet stacks NSS. Each of the plurality of outer insulating spacers 112 may be spaced apart from the first gate line G1 and the second gate line G2 with the gate dielectric film 118 disposed therebetween. The plurality of outer insulating spacers 112 may include, for example, silicon nitride (SiN), silicon oxide ($SiO_2$), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiCN," "SiBN," "SiON," "SiOCN," "SiBCN," and "SiOC" refers to a material including elements included therein, without referring to a chemical formula representing a stoichiometric relationship.

In an embodiment of the present inventive concept, each of the first and second gate lines G1 and G2 may have a structure in which a metal nitride film, a metal film, a conductive capping film, and a gap-fill metal film are sequentially stacked. The metal nitride film and the metal film may include at least one of, for example, titanium (Ti), tantalum (Ta), tungsten (W), ruthenium (Ru), niobium (Nb), molybdenum (Mo), and/or hafnium (Hf). The gap-fill metal film may include, for example, a tungsten (W) film or an aluminum (Al) film. According to an embodiment of the present inventive concept, each of the first and second gate lines G1 and G2 may include at least one work-function metal-containing film. The at least one work-function metal-containing film may include at least one of, for example, titanium (Ti), tungsten (W), ruthenium (Ru), niobium (Nb), molybdenum (Mo), platinum (Pt), ytterbium (Yb), terbium (Tb), dysprosium (Dy), erbium (Er), and/or palladium (Pd). In an embodiment of the present inventive concept, each of the first and second gate lines G1 and G2 may include a stack structure of TiAlC/TiN/W, a stack structure of TiN/TaN/TiAlC/TiN/W, or a stack structure of TiN/TaN/TiN/TiAlC/TiN/W, without being limited thereto.

As shown in FIG. 2, the first and second gate lines G1 and G2 and the gate dielectric film 118, which covers sidewalls of the first and second gate lines G1 and G2, may be covered by a capping insulating pattern 126. The capping insulating pattern 126 may include, for example, a silicon nitride film.

According to an embodiment of the present inventive concept, the first and second source/drain regions SD1 and SD2 may be covered by an insulating liner 114. The insulating liner 114 may conformally cover a surface of each of the first and second source/drain regions SD1 and SD2 and the outer insulating spacer 112. The insulating liner 114 may include, for example, SiN, SiCN, SiBN, SiON, SiOCN, SiBCN, SiOC, $SiO_2$, or a combination thereof.

According to an embodiment of the present inventive concept, the insulating liner 114 may be covered by an inter-gate dielectric film 116. The inter-gate dielectric film 116 may include, for example, a silicon nitride film, a silicon oxide film, SiON, SiOCN, or a combination thereof. According to an embodiment of the present inventive concept, a plurality of capping insulating patterns 126 and the inter-gate dielectric film 116 located between every two adjacent ones of the plurality of capping insulating patterns 126 may be covered by an insulating structure 160. The insulating structure 160 may include an etch stop film 161 and an interlayer insulating film 162. The etch stop film 161 may include, for example, silicon carbide (SiC), silicon nitride (SiN), nitrogen-doped silicon carbide (SiC:N), silicon oxycarbide (SiOC), aluminum nitride (AlN), aluminum oxynitride (AlON), aluminum oxide (AlO), aluminum oxycarbide (AlOC), or a combination thereof. The interlayer insulating film 162 may include, for example, an oxide film, a nitride film, an ultralow-k (ULK) film having an ultralow dielectric constant K of about 2.2 to about 2.4, or a combination thereof. For example, the interlayer insulating film 162 may include a tetraethylorthosilicate (TEOS) film, a high-density plasma (HDP) film, a boro-phospho-silicate glass (BPSG) film, a flowable chemical vapor deposition (FCVD) oxide film, a silicon oxynitride (SiON) film, a silicon nitride (SiN) film, a silicon oxycarbide (SiOC) film, a SiCOH film, or a combination thereof.

According to an embodiment of the present inventive concept, the first diffusion break structure SDB1 may be between the first isolation region IR1 and the second isolation region IR2. According to an embodiment of the present inventive concept, a first source/drain region SD1 may be at a boundary of the first isolation region IR1, and a second source/drain region SD2 may be at a boundary of the second isolation region IR2. According to an embodiment of the present inventive concept, the first diffusion break structure SDB1 may be between the first source/drain region SD1 and the second source/drain region SD2 at a boundary between the first isolation region IR1 and the second isolation region IR2.

According to an embodiment of the present inventive concept, portions of opposing sidewalls of the first diffusion break structure SDB1 may respectively face the first and second source/drain regions SD1 and SD2. According to an embodiment of the present inventive concept, other portions of the opposing sidewalls of the first diffusion break structure SDB1 may face the insulating liner 114.

According to an embodiment of the present inventive concept, the first diffusion break structure SDB1 may include an outer liner 132 and a diffusion break plug 136.

According to an embodiment of the present inventive concept, at a boundary of the first isolation region IR1 and the second isolation region IR2, an outer diffusion break gap OG may be defined by the insulating liner 114 of the first isolation region IR1 and the insulating liner 114 of the second isolation region IR2. According to an embodiment of the present inventive concept, the outer liner 132 may extend in the second lateral direction (e.g., the Y direction) and partially fill the outer diffusion break gap OG. According to an embodiment of the present inventive concept, sidewalls of the insulating liner 114 at each of the boundaries of the first isolation region IR1 and the second isolation region IR2 may be at least partially covered by the outer liner 132. The outer liner 132 is illustrated as partially passing through the outer insulating spacer 112 in FIG. 2, without being limited thereto. For example, the outer liner 132 may entirely pass through the outer insulating spacer 112 and come in contact with the first dummy nanosheet DN1. According to an embodiment of the present inventive concept, the outer liner 132 may partially pass through the inter-gate dielectric film 116. According to an embodiment of the present inventive concept, a portion of the diffusion break plug 136 may be opposite to the inter-gate dielectric film 116 with the outer liner 132 disposed therebetween.

According to an embodiment of the present inventive concept, a first inner diffusion break gap IG1 may be defined by the outer liner 132, the outer insulating spacer 112, the dummy nanosheet stack DNSS, the gate dielectric film 118, and the third sub-fin-type active region SF3. According to an embodiment of the present inventive concept, the diffusion break plug 136 may extend in the second lateral direction (e.g., the Y direction) and fill the first inner diffusion break gap IG1.

According to an embodiment of the present inventive concept, the outer liner 132 may include a nitrogen-containing insulating film. For example, the outer liner may include silicon nitride, SiCN, SiBN, SiON, SiOCN, SiBCN or a combination thereof. According to an embodiment of the present inventive concept, the diffusion break plug 136 may include a nitrogen-containing insulating film. For example, the outer liner may include silicon nitride, SiCN, SiBN, SiON, SiOCN, SiBCN or a combination thereof.

According to an embodiment of the present inventive concept, the outer liner 132 and the diffusion break plug 136 may include the same material as each other. For example, the outer liner 132 may be integrally formed with the diffusion break plug 136.

According to an embodiment of the present inventive concept, a top surface 133 of the first diffusion break structure SDB1 may be at the same vertical level as a top surface of the capping insulating pattern 126 and a top surface of the inter-gate dielectric film 116. According to an embodiment of the present inventive concept, a bottom surface 131 of the first diffusion break structure SDB1 may be at a lower level than a bottom surface SDL of each of the first and second source/drain regions SD1 and SD2. According to an embodiment of the present inventive concept, the bottom surface 131 of the first diffusion break structure SDB1 may be at a lower level than a bottom surface of the first fin-type active region F1 and at a lower level than a bottom surface of the device isolation film 106. For example, the first diffusion break structure SDB1 may pass through a portion of the substrate 102.

According to an embodiment of the present inventive concept, an upper portion of the first diffusion break structure SDB1 may have a groove portion C. According to an embodiment of the present inventive concept, the top surface 133 of the first diffusion break structure SDB1 may be partially penetrated by the groove portion C, which extends in the second lateral direction (e.g., the Y direction). According to an embodiment of the present inventive concept, the groove portion C may be defined by the diffusion break plug 136 and may have a canyon shape extending in the second lateral direction (e.g., Y direction). For example, the groove portion C may have a triangular shape, a round shape, or another polygonal shape. According to an embodiment of the present inventive concept, a width of the groove portion C in the first lateral direction (e.g., the X direction) may be reduced in a direction away from the top surface 133 of the first diffusion break structure SDB1 in the vertical direction (e.g., the Z direction).

According to an embodiment of the present inventive concept, the groove portion C may be filled with a crack filler 141, which extends in the second lateral direction (e.g., the Y direction). According to an embodiment of the present inventive concept, the crack filler 141 may pass through a portion of the first diffusion break structure SDB1 in a direction away from the top surface 133 of the first diffusion break structure SDB1. For example, the crack filler 141 may partially extend into the first diffusion break structure SDB1 from the top surface 133 of the first diffusion break structure SDB1.

According to an embodiment of the present inventive concept, a top surface of the crack filler 141 may be at the same vertical level as the top surface 133 of the first diffusion break structure SDB1. For example, the top surface of the crack filler 141 may be substantially coplanar with the top surface 133 of the first diffusion break structure SDB1.

According to an embodiment of the present inventive concept, the crack filler 141 may include silicon oxide.

According to an embodiment of the present inventive concept, the first diffusion break structure SDB1 may include a head portion H, a neck portion N, a body portion B, and a tail portion T. The head portion H may define the groove portion C at a top surface of the first diffusion break structure SDB1. Both side surfaces of the neck portion N may be covered by the third dummy nanosheet DN3 that is under the head portion H. The body portion B may fill an indent region 146 formed by the dummy nanosheet stack DNSS under the neck portion N. The tail portion T may partially pass through the third sub-fin-type active region SF3 and is under the body portion B.

For example, the indent region 146 may be a space defined by the dummy nanosheet stack DNSS and the gate dielectric film 118. For example, the indent region 146 may be a space defined by sidewalls of the first inner diffusion break gap IG1 having an inwardly concave portion and an outwardly convex portion, based on a central plane CP, which passes through the center of the first diffusion break structure SDB1 in the vertical direction (e.g., the X direction).

According to an embodiment of the present inventive concept, the head portion H may include an outer liner 132. According to an embodiment of the present inventive concept, both sidewalls of the head portion H may be covered by the insulating liner 114. According to an embodiment of the present inventive concept, the head portion H may face the inter-gate dielectric film 116 with the insulating liner 114 therebetween in the first lateral direction (X direction). In an embodiment of the present inventive concept, the head portion H may directly face the inter-gate dielectric film 116.

According to an embodiment of the present inventive concept, the body portion B filling the indent region 146 may include a concave portion 142 and a convex portion 144.

According to an embodiment of the present inventive concept, the concave portion 142 may be an inward portion with respect to the central plane CP of the first diffusion break structure SDB1. According to an embodiment of the present inventive concept, the concave portion 142 may be a portion covered by the first dummy nanosheet DN1 and the second dummy nanosheet DN2, from among both sidewalls of the body portion B2.

According to an embodiment of the present inventive concept, the convex portion 144 may be a portion, which protrudes outward compared to the concave portion 143 with respect to the central plane CP. According to an embodiment of the present inventive concept, the convex portion 144 may fill a portion of a space that is between the first dummy nanosheet DN1 and the top surface FT of the third sub-fin-type active region SF3 and portions of spaces between the first to third dummy nanosheets DN1, DN2, and DN3 in the first diffusion break structure SDB1.

For example, the gate dielectric film 118 may face the body portion B of the first diffusion break structure SDB1 and the first and second source/drain regions SD1 and SD2 in the first lateral direction (e.g., the X direction). For example, the gate dielectric film 118 may face the first to third dummy nanosheets DN1, DN2, and DN3 and the third sub-fin-type active region SF in the vertical direction (e.g., the Z direction).

According to an embodiment of the present inventive concept, the concave portion 142 may face the first and second source/drain regions SD1 and SD2 with the first dummy nanosheet DN1, the third dummy nanosheet DN3, and the gate dielectric film 118 therebetween in the first lateral direction (e.g., the X direction) and the second lateral direction (e.g., the Y direction). According to an embodiment of the present inventive concept, the convex portion 144 may be spaced apart from the first and second source/drain regions SD1 and SD2 with the gate dielectric film 118 therebetween. According to an embodiment of the present inventive concept, the convex portion 144 may be covered by the gate dielectric film 118.

According to an embodiment of the present inventive concept, a first body width bw1, which is a width of the concave portion 142 in the first lateral direction (e.g., the X direction), may be less than a second body width bw2, which is a width of the convex portion 144 in the first lateral direction (e.g., the X direction). According to an embodiment of the present inventive concept, a first neck width nw1, which is a width of the neck portion N in the first lateral direction (e.g., the X direction), may be less than the second body width bw2. According to an embodiment of the present inventive concept, the first neck width nw1 may be substantially equal to the first body width bw1. According to an embodiment of the present inventive concept, a first head width hw1, which is a width of the head portion H in the first lateral direction (e.g., the X direction), may be greater than the first neck width nw1. According to an embodiment of the present inventive concept, the first head width hw1 may be substantially equal to the second body width bw2.

According to an embodiment of the present inventive concept, the first diffusion break structure SDB1 may have a void V inside. According to an embodiment of the present inventive concept, the void V may pass through at least a portion of the body portion B in the vertical direction (e.g., Z direction) and extend in the second lateral direction (e.g., Y direction). In FIG. 2, a length of the void V in the vertical direction (e.g., the Z direction) is illustrated as being greater than a length of the body portion B in the vertical direction (e.g., the Z direction). However, the present inventive concept is not limited thereto, and the length of the void V in the vertical direction (e.g., Z direction) may be less than or equal to the length of the body portion B in the vertical direction (e.g., Z direction).

According to an embodiment of the present inventive concept, the groove portion C and the void V may be arranged in a substantially straight line in the vertical direction (e.g., the Z direction). For example, the groove portion C and the void V may be aligned with each other in the vertical direction (e.g., the Z direction). For example, according to an embodiment of the present inventive concept, the groove portion C and the void V may be arranged side by side along the central plane CP. According to embodiments, the diffusion break plug 136 may be between the groove portion C and the void V. For example, the groove portion C and the void V might not be in communication with each other. For example, the groove portion C and the void V might not be directly connected to each other.

Although the first diffusion break structure SDB1 is illustrated as having one void V in FIG. 2, the first diffusion break structure SDB1 may have a plurality of voids V. In an embodiment of the present inventive concept, the plurality of voids V may be arranged side by side along the central plane CP. In some embodiments, the plurality of voids V may be formed at the same level as the convex portion 144 of the body portion B in the vertical direction (e.g., the Z direction).

Although the void V is illustrated as having a smooth curved surface in FIG. 2, the void V may have a curved surface that has a similar shape to that of the indent region 146.

According to an embodiment of the present inventive concept, the second diffusion break structure SDB2 of the second device region AR2 may have a similar structure to that of the first diffusion break structure SDB1 described above.

According to an embodiment of the present inventive concept, a source/drain contact 153 and a source/drain via contact 163 may be formed on the second source/drain region SD2. According to an embodiment of the present inventive concept, the second source/drain region SD2 may be connected to an upper conductive line through the source/drain contact 153 and the source/drain via contact 163. However, the present inventive concept is not limited thereto, and the source/drain contact 153 and the source/drain via contact 163 may be formed on the first source/drain region SD1. Although FIG. 1 illustrates a case in which one source/drain contact 153 and one source/drain via contact 163 are formed, a plurality of source/drain contacts 153 and a plurality of source/drain via contacts 163 may be formed on the first and second source/drain regions SD1 and SD2.

According to an embodiment of the present inventive concept, a metal silicide film 152 may be formed between the second source/drain region SD2 and the source/drain contact 153. In an embodiment of the present inventive concept, the metal silicide film 152 may include Ti, W, Ru, Nb, Mo, Hf, Ni, Co, Pt, Yb, Tb, Dy, Er, or Pd. For example, the metal silicide film 152 may include titanium silicide. According to an embodiment of the present inventive concept, the source/drain contact 153 may pass through the inter-gate dielectric film 116 and the insulating liner 114 in the vertical direction (e.g., the Z direction) and come in contact with the metal silicide film 152. The source/drain via contact 163 may pass through the insulating structure 160 in the vertical direction (e.g., the Z direction) and be in contact with a top surface of the source/drain contact 153.

According to an embodiment of the present inventive concept, the source/drain contact 153 may include a conductive barrier film 154 and a metal plug 156. The source/drain via contact 163 may include a conductive barrier film 164 and a metal plug 166. The conductive barrier films 154 and 164 may include, for example, titanium (Ti), tantalum (Ta), titanium nitride (TiN), tantalum nitride (TaN), or a combination thereof, and the metal plugs 156 and 166 may include, for example, tungsten (W), cobalt (Co), copper (Cu), ruthenium (Ru), manganese (Mn), or a combination thereof, without being limited thereto. In an embodiment of the present inventive concept, sidewalls of each of the source/drain contact 153 and a plurality of source/drain via contacts 163 may be at least partially surrounded by contact insulating spacers. The contact insulating spacer may include, for example, SiCN, SiOCN, SiN, or a combination thereof, without being limited thereto.

A gate contact may be formed in an upper portion of each of the first and second gate lines G1 and G2. Each of the first and second gate lines G1 and G2 may be connected to an upper conductive line through the gate contact. The gate contact may have substantially the same structure as that of the source/drain contact 153 and the source/drain via contact 163 described above.

Figure 3:
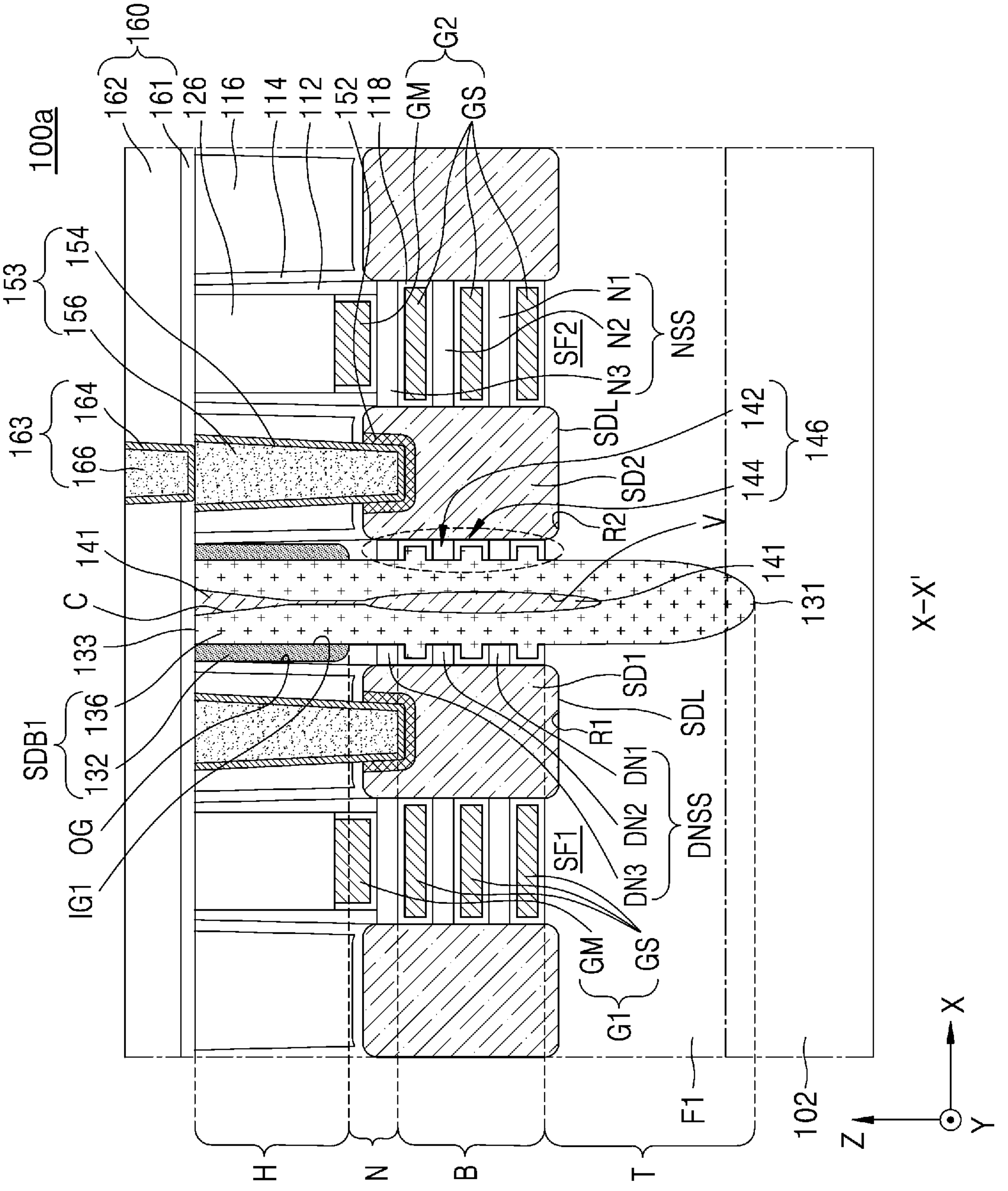
FIG. 3 is a cross-sectional view taken along line X-X' of FIG. 1 to illustrate an IC device having the layout diagram of FIG. 1, according to an embodiment of the present inventive concept.

FIG. 3 is a cross-sectional view taken along line X-X' of FIG. 1 to illustrate an IC device 100*a* having the layout diagram of FIG. 1, according to an embodiment of the present inventive concept. The difference between the embodiments shown in FIGS. 2 and 3 may be whether the groove portion C and the void V are in communication with each other.

Referring to FIG. 3, a width in the first lateral direction (e.g., the X direction) of a portion where the groove portion C is in communication with the void V may be less than each of a width of the groove portion C in the first lateral direction (e.g., the X direction) and a width of the void V in the first lateral direction (e.g., the X direction). However, the present inventive concept is not limited thereto, and the width of the void V in the first lateral direction (e.g., the X direction) may be less than or equal to the width in the first lateral direction (e.g., the X direction) of the portion where the groove portion C is in communication with the void V.

According to an embodiment of the present inventive concept, a crack filler 141 may fill the void V and the portion where the groove portion C is in communication with the void V. Although the crack filler 141 is illustrated as filling the void V and the portion where the groove portion C is in communication with the void V in FIG. 3, the crack filler 141 might not fill the void V. For example, the crack filler 141 may cover an entrance of the void V (e.g., the portion where the groove portion C is in communication with the void V) such that the void V is not in communication with the outside. In this case, the void V may be defined by the crack filler 141 and the diffusion break plug 136.

Figure 4:
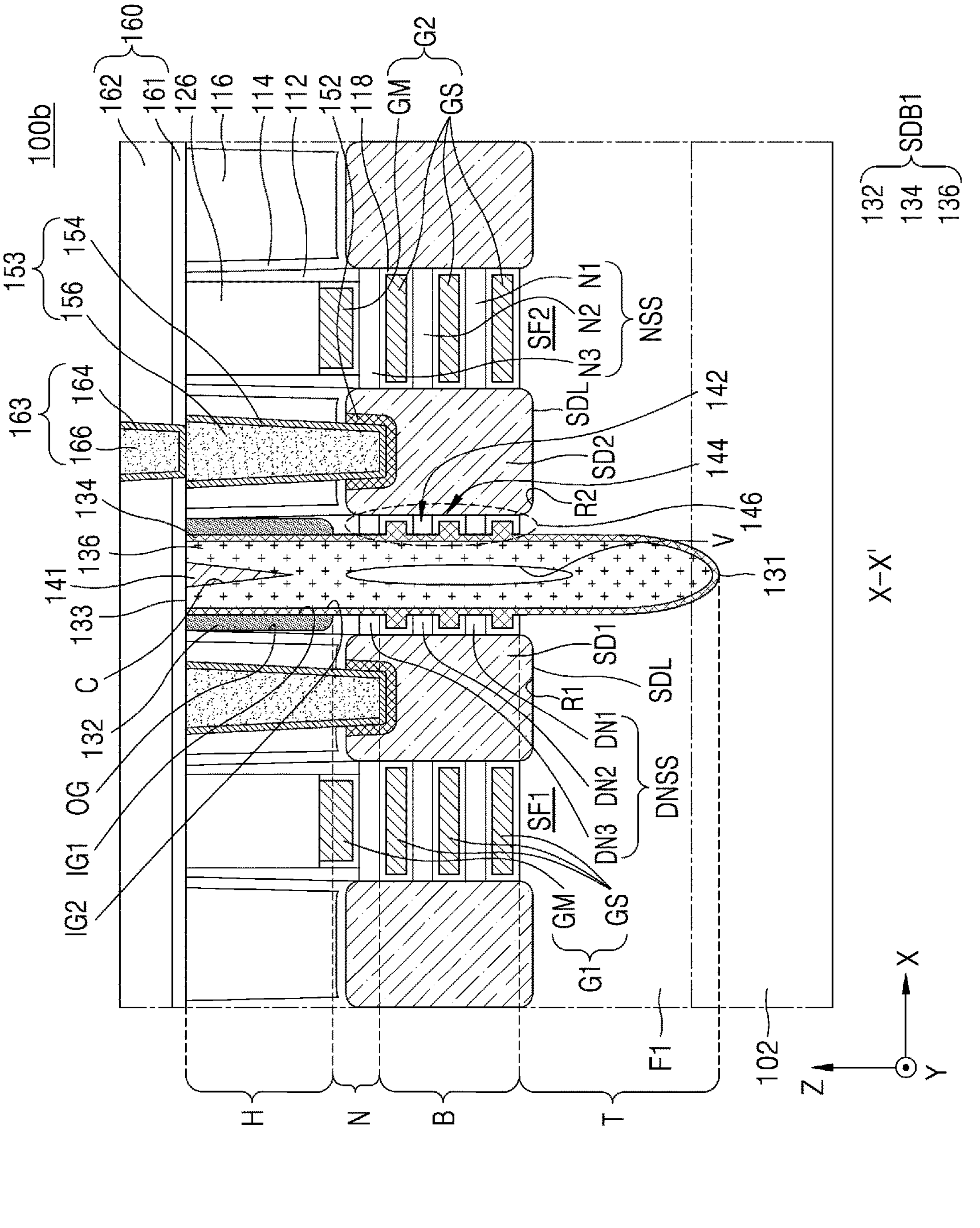
FIG. 4 is a cross-sectional view taken along line X-X' of FIG. 1 to illustrate an IC device having the layout diagram of FIG. 1, according to an embodiment of the present inventive concept.

FIG. 4 is a cross-sectional view taken along line X-X' of FIG. 1 to illustrate an IC device 100*b* having the layout diagram of FIG. 1, according to an embodiment of the present inventive concept. The difference between the embodiments shown in FIGS. 1 and 4 may be whether a first diffusion break structure SDB1 includes an inner liner 134.

Referring to FIG. 4, the first diffusion break structure SDB1 may further include the inner liner 134 at least partially surrounding a diffusion break plug 136. According to an embodiment of the present inventive concept, the inner liner 134 may define a second inner diffusion break gap IG2 while covering an inner wall and a lower wall of the first inner diffusion break gap IG1. According to an embodiment of the present inventive concept, the inner liner 134 may fill an indent region 146 of the first inner diffusion break gap IG1.

According to an embodiment of the present inventive concept, the inner liner 134 of a body portion B may face the diffusion break plug 136, a gate dielectric film 118, and first and second dummy nanosheets DN1 and DN2. According to an embodiment of the present inventive concept, the inner liner 134 of the head portion H may be partially surrounded by the outer liner 132.

According to an embodiment of the present inventive concept, the diffusion break plug 136 may partially fill the second inner diffusion break gap IG2 and have a void V inside, and a top surface of the diffusion break plug 136 may be partially penetrated by a crack filler 141.

According to an embodiment of the present inventive concept, the void V of the first diffusion break structure SDB1 including the inner liner 134 may be less than the void V of the first diffusion break structure SDB1 of FIG. 2, which does not include the inner liner 134.

According to an embodiment of the present inventive concept, of an inner wall of the second inner diffusion break gap IG2, an inner wall of the body portion B might not have the indent region 146. For example, of the inner wall of the second inner diffusion break gap IG2, the inner wall of the body portion B may have a smoother surface than the indent region 146 of the first inner diffusion break gap IG1. In this case, the diffusion break plug 136 might not have a concave surface or a convex surface.

Although FIG. 4 illustrates a case in which a groove portion C is not in communication with the void V, the groove portion C and/or the void V may extend in the vertical direction (e.g., the Z direction), and thus, the groove portion C and the void V may be in communication with each other. In an embodiment of the present inventive concept, when the groove portion C is in communication with the void V, the crack filler 141 may fill the void V. In an embodiment of the present inventive concept, although the groove portion C is in communication with the void V, the crack filler 141 might not fill the void V.

Figure 5:
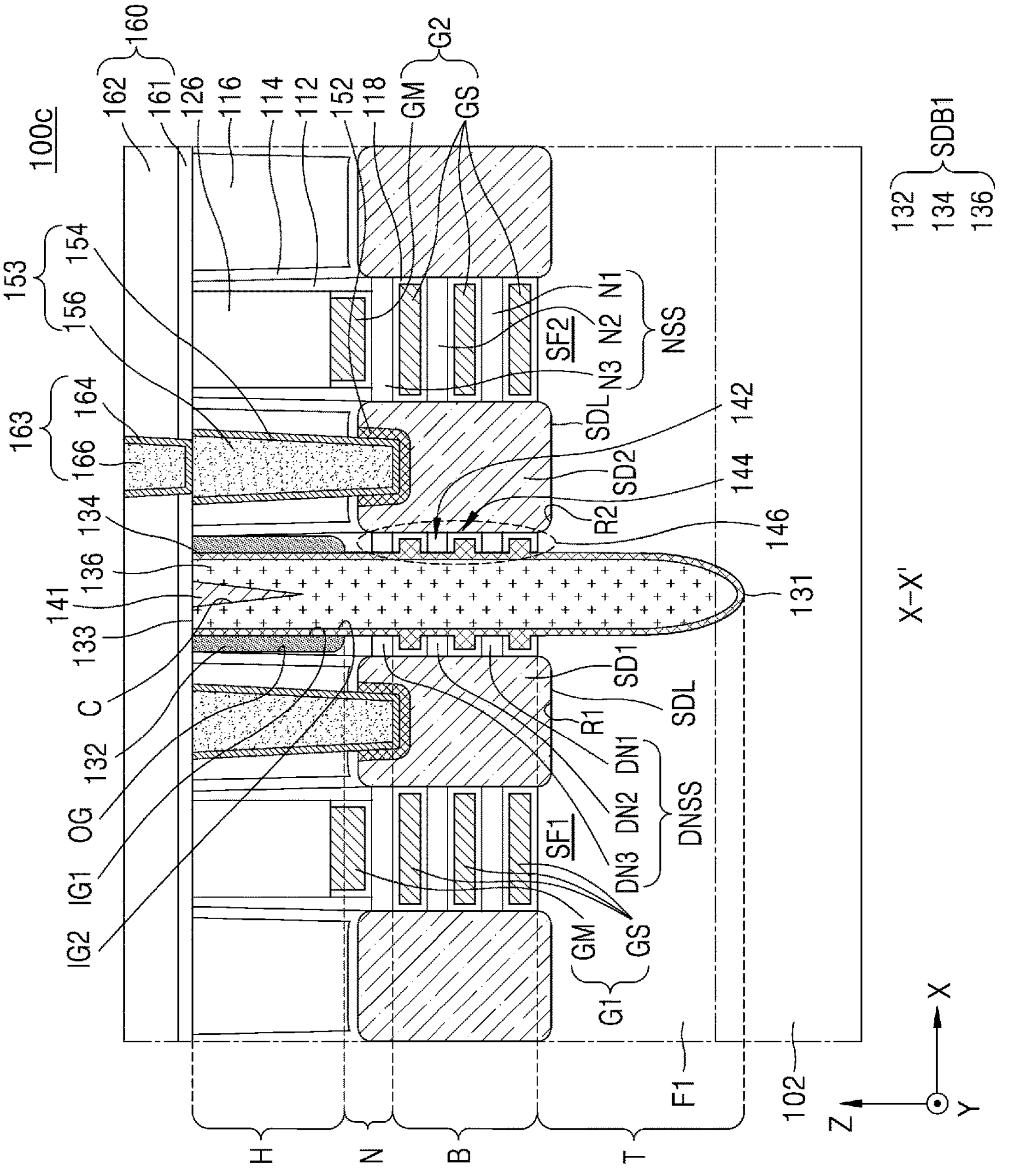
FIG. 5 is a cross-sectional view taken along line X-X' of FIG. 1 to illustrate an IC device having the layout diagram of FIG. 1, according to an embodiment of the present inventive concept.

FIG. 5 is a cross-sectional view taken along line X-X' of FIG. 1 to illustrate an IC device 100*c* having the layout diagram of FIG. 1, according to an embodiment of the present inventive concept. The difference between the embodiments shown in FIGS. 4 and 5 may be whether a first diffusion break structure SDB1 has a void V inside.

Referring to FIG. 5, because the first diffusion break structure SDB1 includes the inner liner 134, the first diffusion break structure SDB1 might not have the void V.

FIGS. 6A to 6M are cross-sectional views corresponding to the cross-sectional view of FIG. 2 to illustrate a process sequence of a method of manufacturing an IC device 100, according to an embodiment of the present inventive concept. Specifically, FIGS. 6A to 6F are cross-sectional views taken along lines X-X' and Y-Y' of FIG. 1, and FIGS. 6G to 6M are cross-sectional views taken along line X-X' of FIG. 1.

Figure 6A:
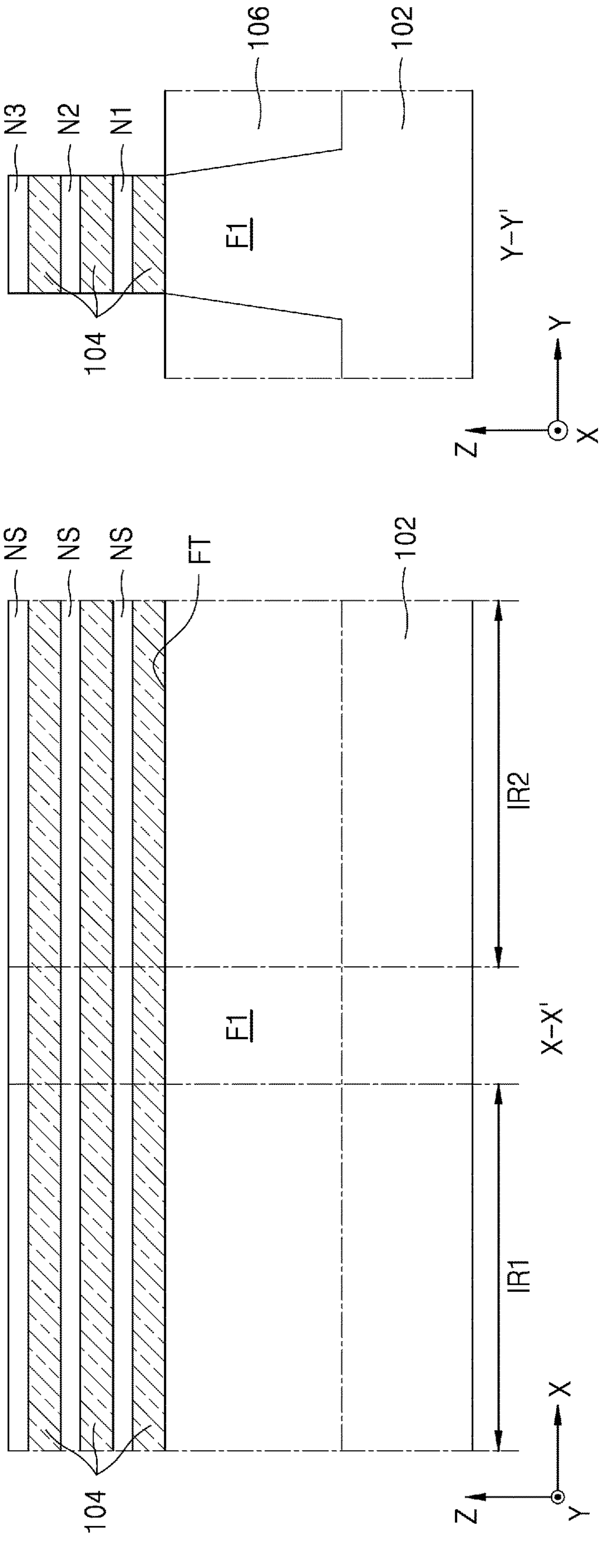
FIGS. 6A, 6B, 6C, 6D, 6E, 6F, 6G, 6H, 6I, 6J, 6K, 6L, and 6M are cross-sectional views corresponding to the cross-sectional view of FIG. 2 to illustrate a method of manufacturing an IC device, according to an embodiment of the present inventive concept.

Referring to FIG. 6A, a plurality of sacrificial semiconductor layers 104 and a plurality of nanosheet semiconductor layers NS may be alternately stacked one-by-one on a substrate 102. In a first device region AR1 and a second device region AR2, respective portions of the plurality of sacrificial semiconductor layers 104, the plurality of nanosheet semiconductor layers NS, and the substrate 102 may be etched to form a plurality of fin-type active regions (e.g., first and second fin-type active regions F1 and F2). The first and second fin-type active regions F1 and F2 may protrude upward from the substrate 102 in a vertical direction (e.g., the Z direction) and extend parallel to each other in a first lateral direction (e.g., the X direction). A device isolation film 106 may be formed to cover opposing lower sidewalls of each of the first and second fin-type active regions F1 and F2. A top surface of the device isolation film 106 may be at substantially the same level as a fin top surface FT of each of the first and second fin-type active regions F1 and F2.

In the first device region AR1 and the second device region AR2, a stack structure of the plurality of sacrificial semiconductor layers 104 and the plurality of nanosheet semiconductor layers NS may remain on the fin top surface FT of each of the first and second fin-type active regions F1 and F2.

The plurality of sacrificial semiconductor layers 104 and the plurality of nanosheet semiconductor layers NS may include semiconductor materials having different etch selectivities from each other. In an embodiment of the present inventive concept, a plurality of nanosheet semiconductor layers NS may include a Si layer, and the plurality of sacrificial semiconductor layers 104 may include a SiGe layer. In an embodiment of the present inventive concept, the plurality of sacrificial semiconductor layers 104 may have a Ge content. The SiGe layer included in the plurality of sacrificial semiconductor layers 104 may have a constant Ge content, which is selected in a range of about 5 at % to about 60 at %, for example, about 10 at % to about 40 at %. The Ge concentration of the SiGe layer included in the plurality of sacrificial semiconductor layers 104 may be variously selected as needed.

Figure 6B:
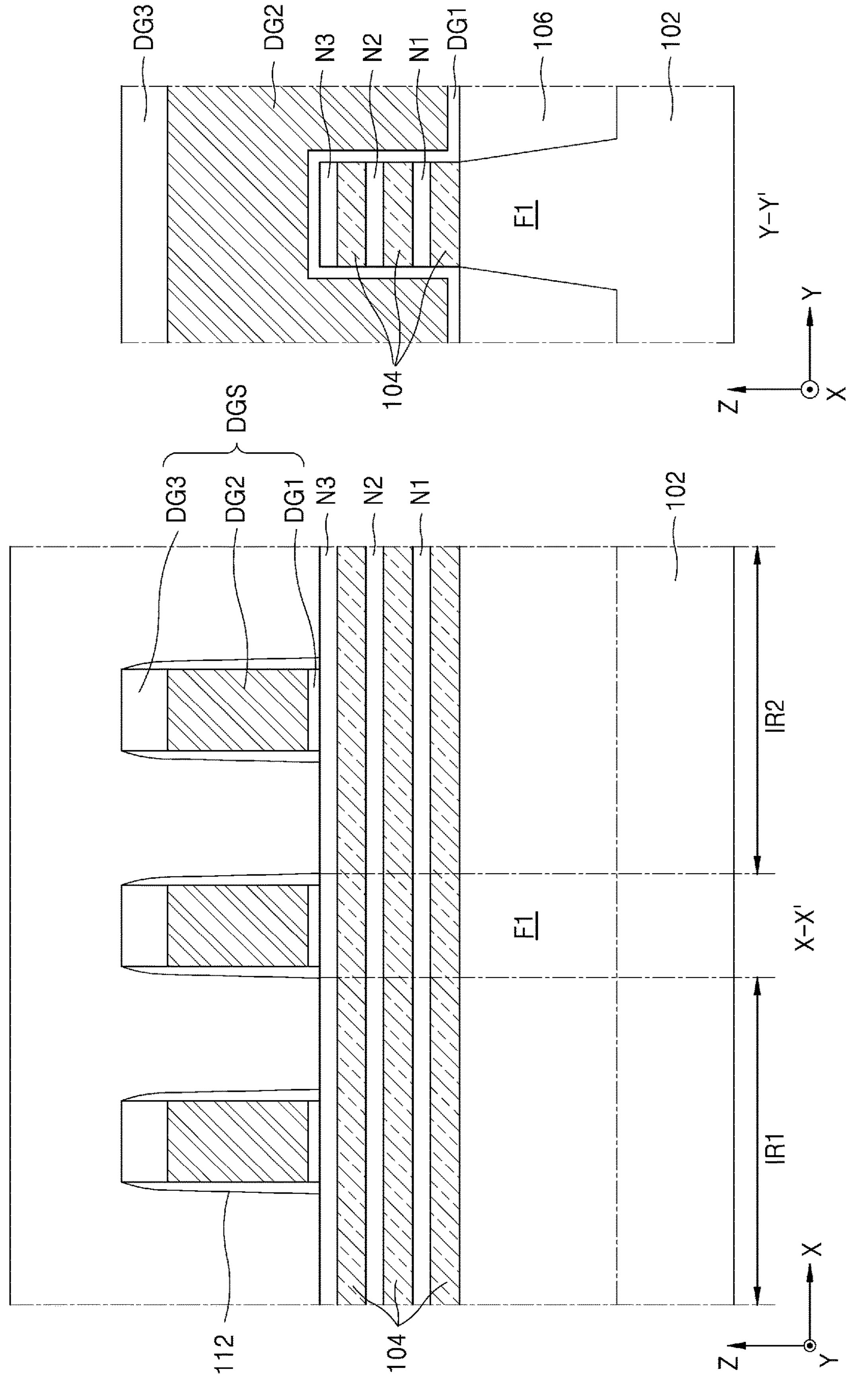
Figure 6C:
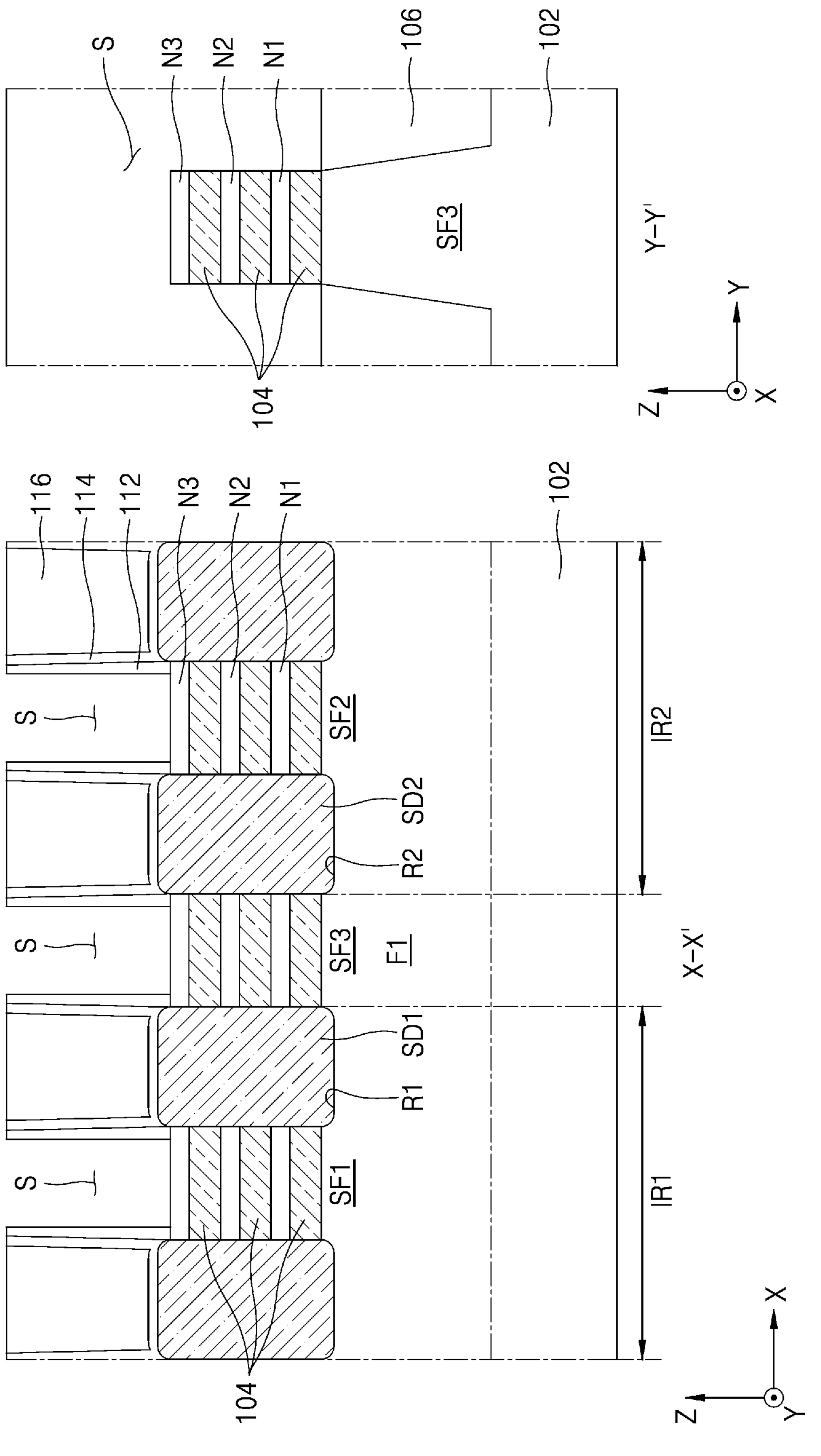

Referring to FIGS. 6B and 6C together, a plurality of dummy gate structures DGS may be formed on the stack structure of the plurality of sacrificial semiconductor layers 104 and the plurality of nanosheet semiconductor layers NS, and outer insulating spacers 112 may be formed to both sidewalls each of the plurality of dummy gate structures DGS. The plurality of dummy gate structures DGS may be formed to continuously extend along the second lateral direction (e.g., the Y direction) at positions corresponding to the first to fourth gate lines G1, G2, G3, and G4 shown in FIG. 1.

Each of the plurality of dummy gate structures DGS may have a structure in which a dummy oxide film DG1, a dummy gate layer DG2, and a capping layer DG3 are sequentially stacked on the nanosheet semiconductor layers NS. In an embodiment of the present inventive concept, the dummy gate layer DG2 may include a polysilicon film, and the capping layer DG3 may include a silicon nitride film.

Thereafter, the second device region AR2 may be covered by a mask, and respective portions of the plurality of sacrificial semiconductor layers 104 and the plurality of nanosheet semiconductor layers NS may be removed by using the dummy gate structure DGS and the outer insulating spacers 112 as etch masks in the first device region AR1. Thus, in the first device region AR1, a plurality of nanosheet stacks NSS may be formed from the plurality of nanosheet semiconductor layers NS. Each of the plurality of nanosheet stacks NSS may include first to third nanosheets N1, N2, and N3. In the first device region AR1, partial regions of the first fin-type active region F1, which are respectively exposed between the plurality of nanosheet stacks NSS, may be etched to form a plurality of first and second recesses R1, R2 in an upper portion of the first fin-type active region F1. For example, a partial portion of the first sub-fin-type active region SF1 that is in the first isolation region IR1 may be etched to form the first recess R1. For example, a portion of the second sub-fin-type active region SF2 that is in the second isolation region IR2 may be etched to form the second recess R2. For example, the third sub-fin-type active region SF3 may be the first fin-type active region F1 between the first recess R1 at a boundary of the first isolation region IR1 and the second recess R2 at a boundary of the second isolation region IR2. To form the plurality of first and second recesses R1 and R2, the first fin-type active region F1 may be etched by using a dry etching process, a wet etching process, or a combination thereof.

Thereafter, first and second source/drain regions SD1 and SD2 may be formed on opposing sides of each of the plurality of nanosheet stacks NSS. For example, a plurality of first source/drain regions SD1 may be formed on the first sub-fin-type active region SF1, and a plurality of second source/drain regions SD2 may be formed on the second sub-fin-type active region SF2. To form a plurality of first and second source/drain regions SD1 and SD2, a semiconductor material may be epitaxially grown from a surface of the first fin-type active region F1 exposed at a bottom surface of each of the plurality of first and second recesses R1 and R2 and a sidewall of each of the first to third nanosheets N1, N2, and N3. In an embodiment of the present inventive concept, to form the plurality of first and second source/drain regions SD1 and SD2, a low-pressure chemical vapor deposition (LPCVD) process, a selective epitaxial growth (SEG) process, or a cyclic deposition and etching (CDE) process may be performed by using source materials including an element semiconductor precursor. In an embodiment of the present inventive concept, the plurality of first and second source/drain regions SD1 and SD2 may include a Si layer doped with an n-type dopant. To form the plurality of first and second source/drain regions SD1 and SD2, silane ($SiH_4$), disilane ($Si_2H_6$), trisilane ($Si_3H_8$), and/or dichlorosilane ($SiH_2Cl_2$) may be used as a Si source. The n-type dopant may include at least one of, for example, phosphorus (P), arsenic (As), and/or antimony (Sb).

Thereafter, the first device region AR1 may be covered by a mask, and a plurality of source/drain regions may be formed in the second device region AR2 in the same manner as described above. According to an embodiment of the present inventive concept, the plurality of source/drain regions of the second device region AR2 may include a silicon germanium (SiGe) layer doped with a p-type dopant. To form the plurality of source/drain regions, a Si source and a Ge source may be used. Silane ($SiH_4$), disilane ($Si_2H_6$), trisilane ($Si_3H_8$), and/or dichlorosilane ($SiH_2Cl_2$) may be used as the Si source. Germane ($GeH_4$), digermane ($Ge_2H_6$), trigermane ($Ge_3H_8$), tetragermane ($Ge_4H_{10}$), and/or dichlorogermane ($Ge_2H_2Cl_2$) may be used as the Ge source. The p-type dopant may include at least one of, for example, boron (B) and/or gallium (Ga).

Thereafter, an insulating liner 114 may be formed to cover respective surfaces of the plurality of first and second source/drain regions SD1 and SD2 of the first device region AR1 and respective surfaces of the plurality of source/drain regions of the second device region AR2, and an inter-gate dielectric film 116 may be formed on the insulating liner 114. Afterwards, the capping layer DG3 may be removed, and the plurality of outer insulating spacers 112, the insulating liner 114, and the inter-gate dielectric film 116 may be planarized to expose a top surface of the dummy gate layer DG2. In addition, the dummy oxide film DG1 and the dummy gate layer DG2 may be further removed to form gate spaces S. In this case, the outer insulating spacers 112, the first to third nanosheets N1, N2, and N3, the sacrificial semiconductor layer 104, and the device isolation film 106 may be exposed through the gate spaces S.

Hereinafter, methods of forming a first diffusion break structure SDB1 and first and second gate lines G1 and G2 of the first device region AR1 will be described. A second diffusion break structure SDB2 and third and fourth gate lines G3 and G4 of the second device region AR2 may be formed using the same methods as the first diffusion break structure SDB1 and the first and second gate lines G1 and G2 of the first device region AR1.

Figure 6D:
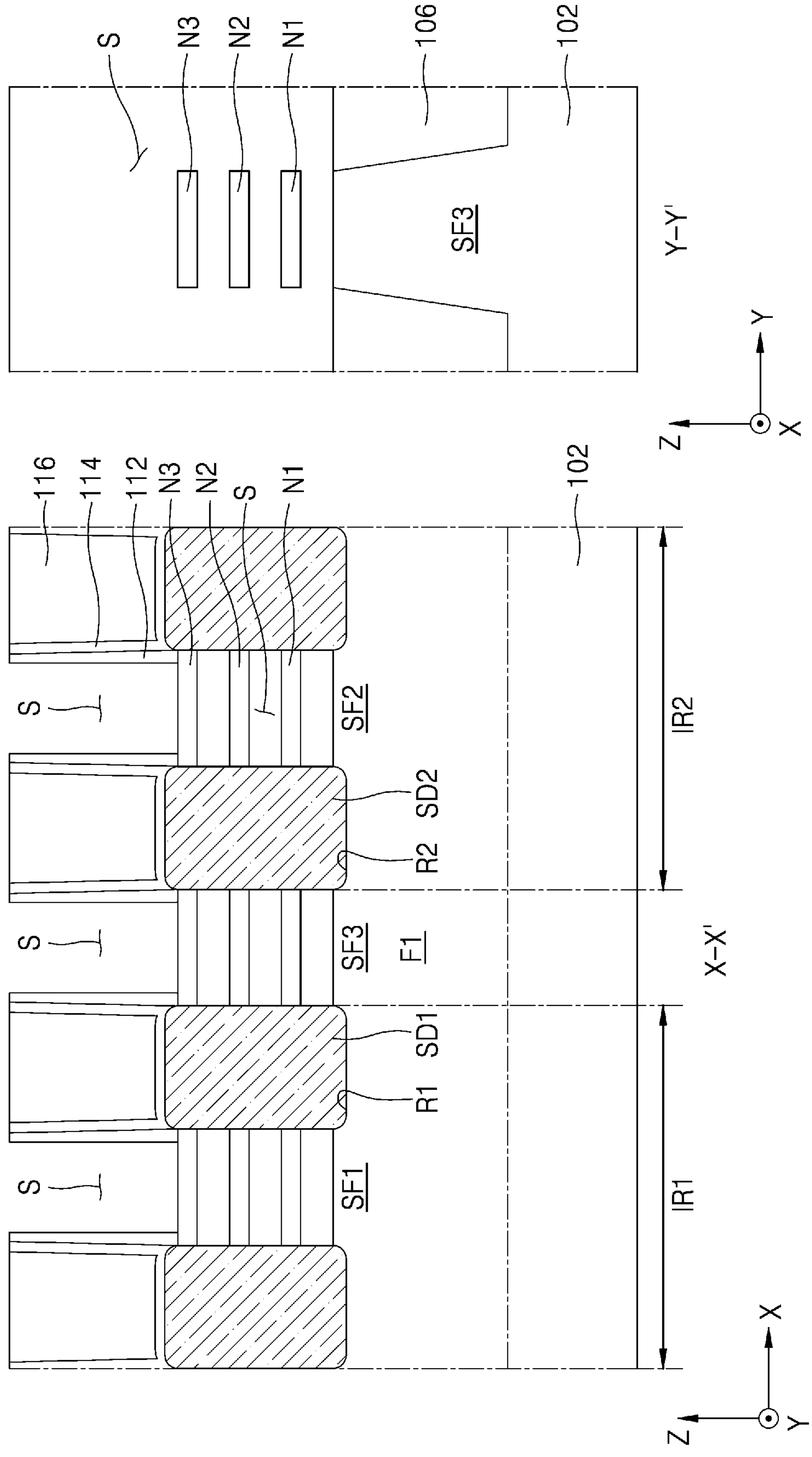
Figure 6E:
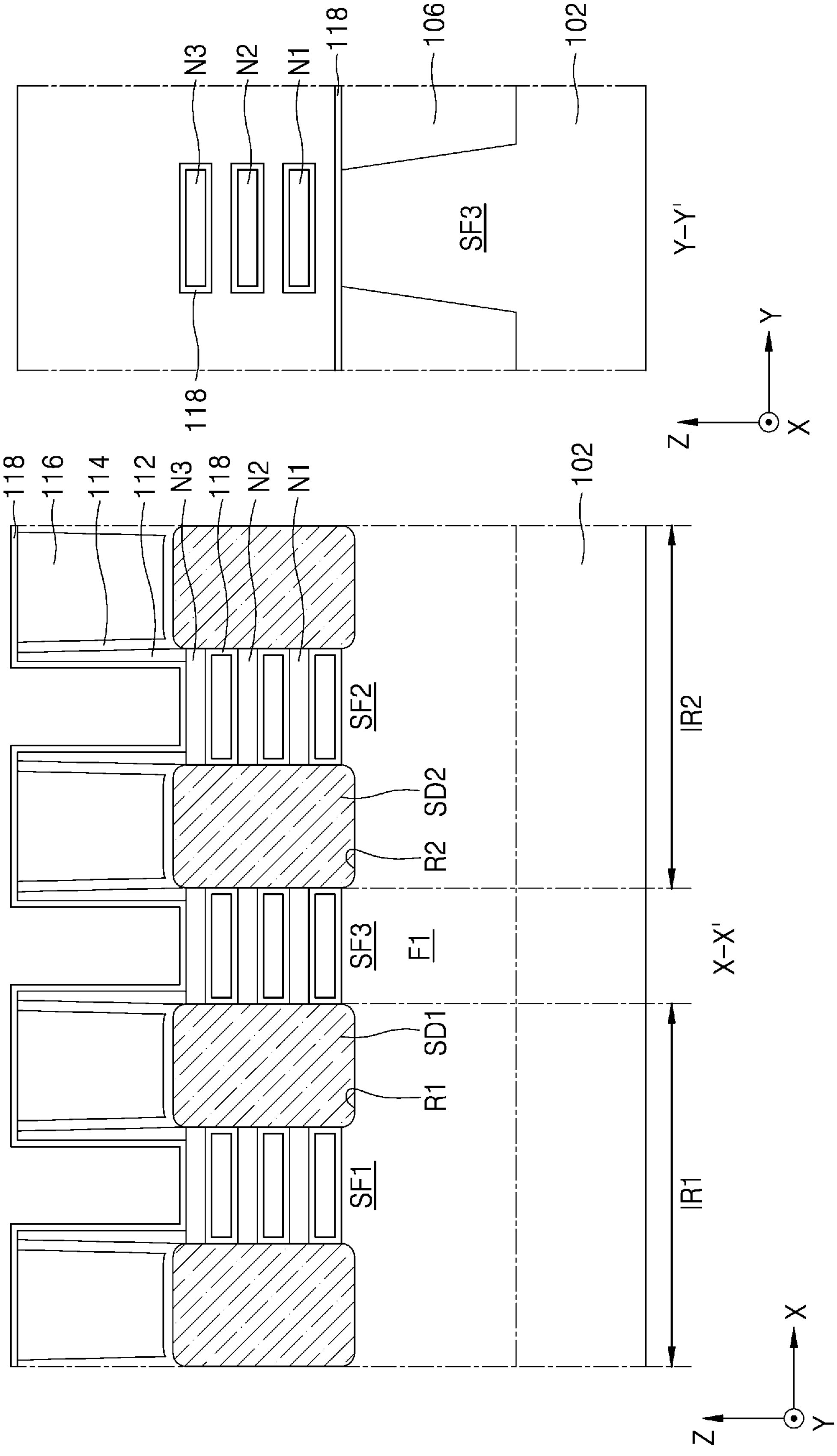

Referring to FIGS. 6D and 6E together, in the resultant structure of FIG. 6C, the plurality of sacrificial semiconductor layers 104 remaining on the first fin-type active region F1 may be removed through the gate spaces S on the nanosheet stacks NSS. Thus, the gate spaces S may be extended to respective spaces between the first to third nanosheets N1, N2, and N3 and a space between the first nanosheet N1 and the fin top surface FT of the first fin-type active region F1.

In an embodiment of the present inventive concept, to selectively remove the plurality of sacrificial semiconductor layers 104, etch selectivities of the first to third nanosheets N1, N2, and N3 with respect to the plurality of sacrificial semiconductor layers 104 may be used. A liquid or gaseous etchant may be used to selectively remove the plurality of sacrificial semiconductor layers 104. In an embodiment of the present inventive concept, to selectively remove the plurality of sacrificial semiconductor layers 104, a $CH_3COOH$-based etchant, for example, an etchant including a mixture of $CH_3COOH$, $HNO_3$, and HF or an etchant including a mixture of $CH_3COOH$, $H_2O_2$, and HF may be used, but the present inventive concept is not limited thereto.

Thereafter, a gate dielectric film 118 may be formed to cover respective exposed surfaces of the first to third nanosheets N1, N2, and N3 and the fin-type active region FA. According to an embodiment of the present inventive concept, the gate dielectric film 118 may be formed to conformally cover surfaces of a plurality of outer insulating spacers 112, which are exposed through the gate space S.

Figure 6F:
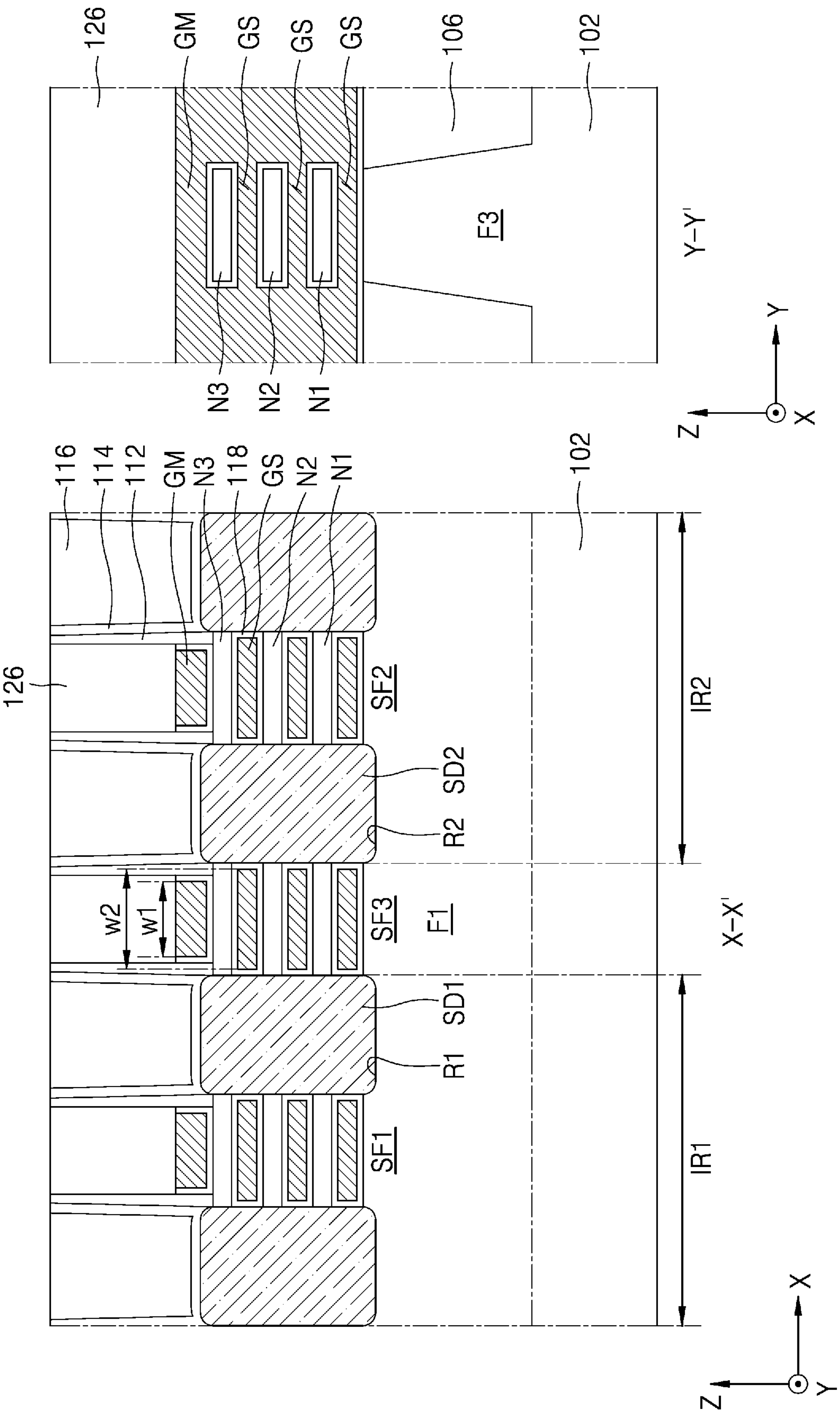

Referring to FIG. 6F, on the first fin-type active region F1, a plurality of gate lines (e.g., the first and second gate lines G1 and G2) and a dummy gate line DGL may be formed to fill the gate space S. According to an embodiment of the present inventive concept, the first gate line G1 extending in the second lateral direction (e.g., the Y direction) may be formed on the first sub-fin-type active region SF1, and the second gate line G2 extending in the second lateral direction (e.g., the Y direction) may be formed on the second sub-fin-type active region SF2. According to an embodiment of the present inventive concept, the dummy gate line DGL extending in the second lateral direction (e.g., the Y direction) may be formed on the third sub-fin-type active region SF3. Thus, a plurality of sub-gate portions GS may be formed between the first to third nanosheets N1, N2, and N3 and between the first nanosheet N1 and the fin top surface FT of the first fin-type active region F1, and a main gate portion GM may be formed on the third nanosheet N3. In this case, the plurality of first and second gate lines G1 and G2 and the dummy gate line DGL may face the first to third nanosheets N1, N2, and N3 and the fin top surface FT of the first fin-type active region F1 with the gate dielectric film 118 disposed therebetween. Afterwards, a capping insulating pattern 126 may be formed to cover top surfaces of the plurality of first and second gate lines G1 and G2 and the dummy gate line DGL.

According to an embodiment of the present inventive concept, both sidewalls of the main gate portion GM may face the outer insulating spacer 112 with the gate dielectric film 118 disposed therebetween. According to an embodiment of the present inventive concept, two sidewalls of the plurality of sub-gate portions GS may face the plurality of first and second source/drain regions SD1 and SD2 with the gate dielectric film 118 disposed therebetween. According to an embodiment of the present inventive concept, a first width w1 of the main gate portion GM in the first lateral direction (e.g., the X direction) may be less than a second width w2 of the sub-gate portion GS in the first lateral direction (e.g., the X direction).

Figure 6G:
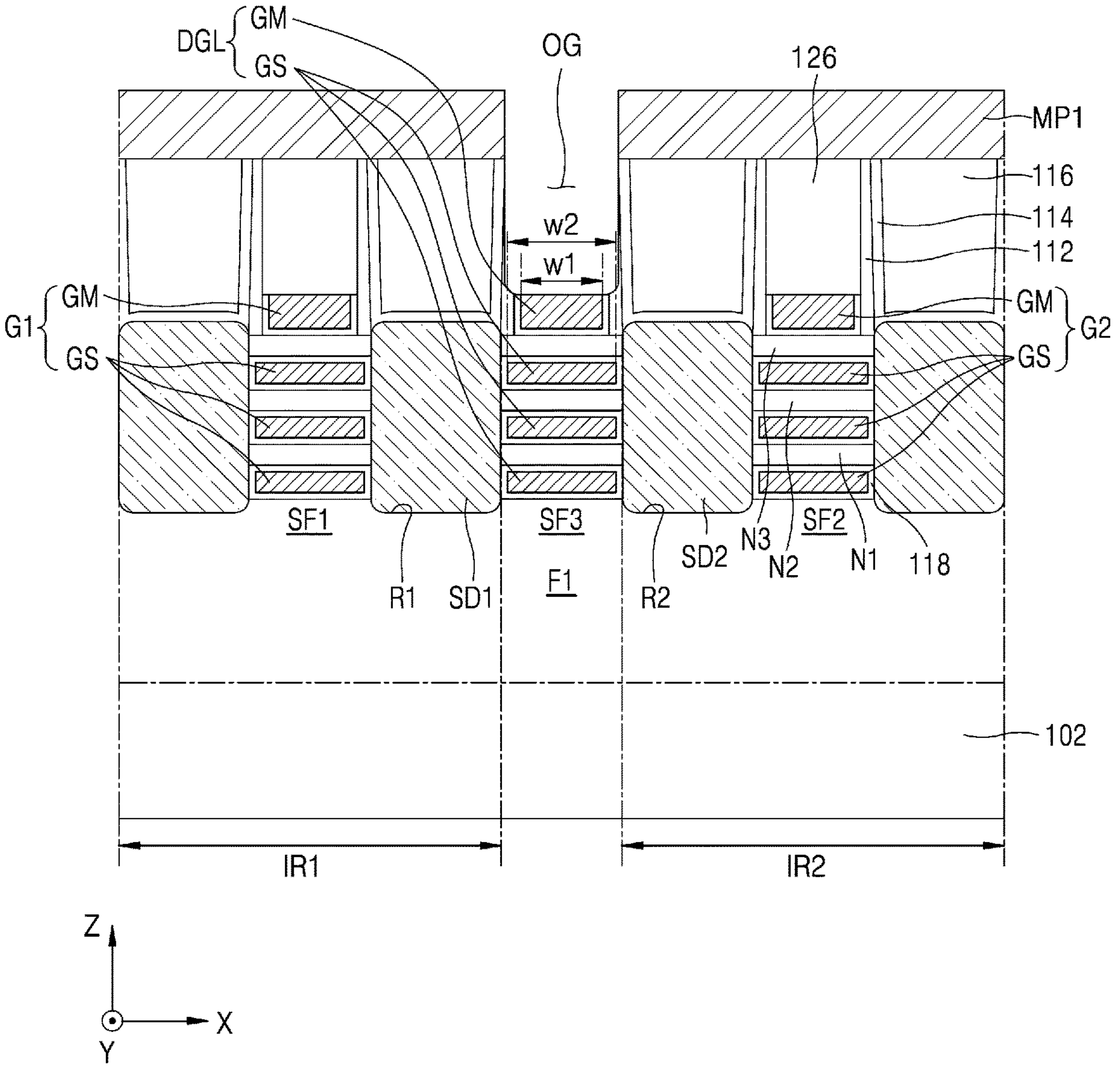

Referring to FIG. 6G, a first mask pattern MP1 may cover the first isolation region IR1 and the second isolation region IR2. On the third sub-fin-type active region SF3, the first mask pattern MP1 may expose the capping insulating pattern 126 covering the top surface of the dummy gate line DGL. An outer diffusion break gap OG may be formed by etching an open region through the first mask pattern MP1. According to an embodiment of the present inventive concept, the outer diffusion break gap OG may expose the main gate portion GM of the dummy gate line DGL. According to an embodiment of the present inventive concept, the outer diffusion break gap OG may be defined by the insulating liner 114, the outer insulating spacer 112, the gate dielectric film 118, and the main gate portion GM. In an embodiment of the present inventive concept, a width of the outer diffusion break gap OG in the first lateral direction (e.g., the X direction) may be greater than the first width w1. In an embodiment of the present inventive concept, the width of the outer diffusion break gap OG in the first lateral direction (e.g., the X direction) may be substantially equal to or greater than the second width w2. In an embodiment of the present inventive concept, the width of the outer diffusion break gap OG in the first lateral direction (e.g., the X direction) may be less than the second width w2.

Figure 6H:
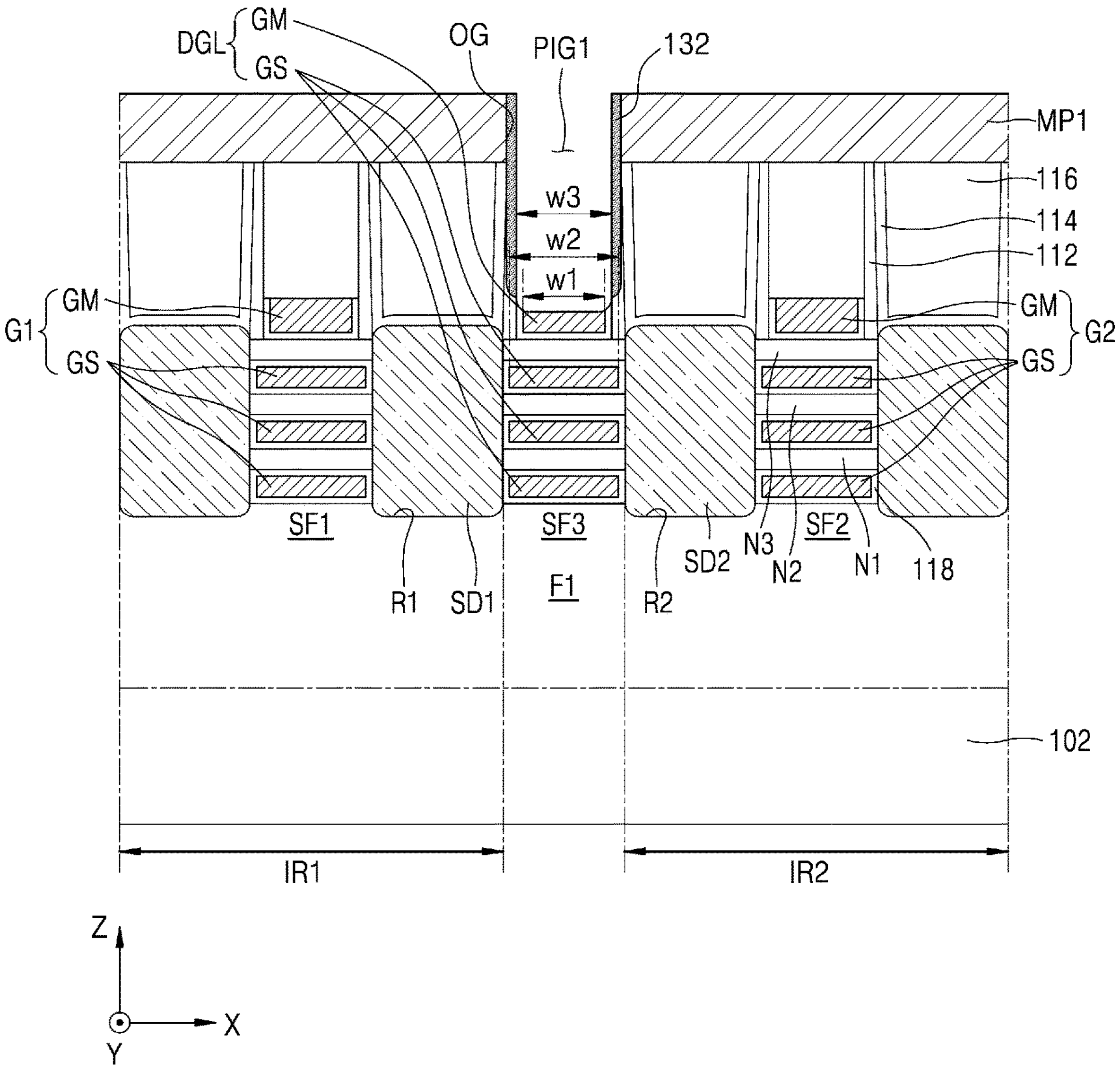

Referring to FIG. 6H, a preliminary outer liner may be formed to conformally cover a sidewall and a bottom of the outer diffusion break gap OG. Subsequently, an additional etching process may be performed to expose the main gate portion GM of the dummy gate line DGL again, and an outer liner 132 may be formed to cover the sidewall of the outer diffusion break gap OG. According to an embodiment of the present inventive concept, the insulating liner 114, which is exposed, may be covered by the outer liner 132. Accordingly, a first preliminary inner diffusion break gap PIG1, of which two sidewalls are defined by the outer liner 132, may be formed. According to an embodiment of the present inventive concept, a width (i.e., a third width w3) of the first preliminary inner diffusion break gap PIG1 in the first lateral direction (e.g., the X direction) may be greater than the first width w1). In this case, the gate dielectric film 118 surrounding the sidewalls of the main gate portion GM may be partially exposed. According to an embodiment of the present inventive concept, the third width w3 of the first preliminary inner diffusion break gap PIG1 may be less than the second width w2. According to an embodiment of the present inventive concept, the third width w3 may be substantially equal to the first width w1.

Figure 6I:
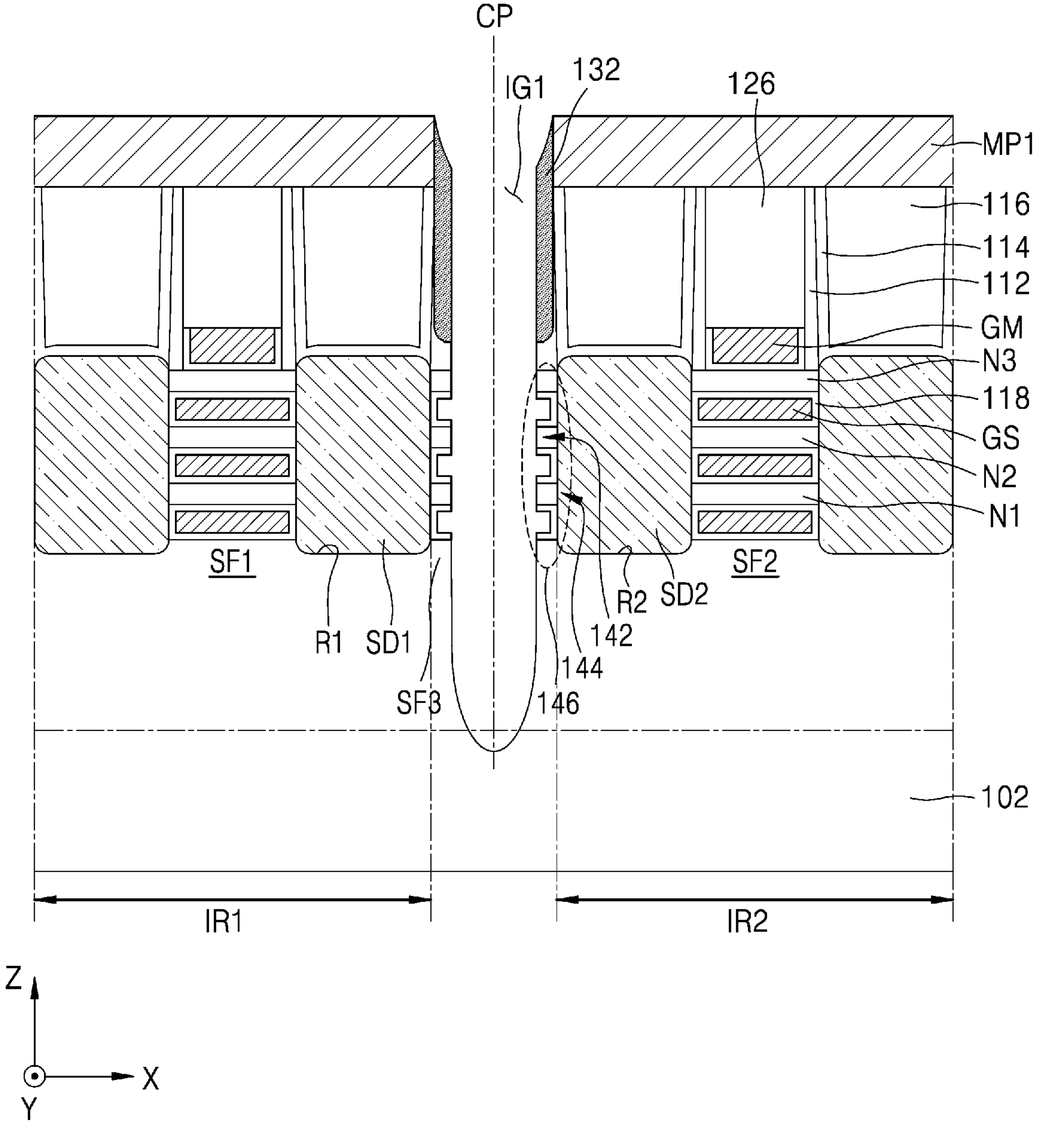

Referring to FIGS. 6H and 6I, the dummy gate line DGL, which is exposed through the first preliminary inner diffusion break gap PIG1, may be removed. For example, the dummy gate line DGL may be firstly selectively removed by using a wet etching process. Accordingly, the gate dielectric film 118 surrounding the first to third nanosheets N1, N2, and N3 may be exposed.

Thereafter, a dry etching process may be performed by using the first mask pattern MP1 and the outer liner 132 as etch masks. For example, of the gate dielectric film 118 surrounding the first to third nanosheets N1, N2, and N3, a portion overlapping the first preliminary inner diffusion break gap PIG1 in the vertical direction (e.g., the Z direction) may be removed. Further, a first inner diffusion break gap IG1 may be formed to at least partially pass through the third sub-fin-type active region SF3. Accordingly, a plurality of dummy nanosheets (e.g., DN1, DN2, and DN3), in which the first to third nanosheets N1, N2, and N3 are penetrated by the first inner diffusion break gap IG1, may be formed, and an indent region 146, which is defined by the plurality of dummy nanosheets (e.g., DN1, DN2, and DN3) and the gate dielectric film 118, may be formed. For example, the indent region 146 may have a shape corresponding to an inwardly concave portion and an outwardly convex portion of two sidewalls of the first inner diffusion break gap IG1, based on a central plane CP extending through a center of the first inner diffusion break gap IG1.

Figure 6J:
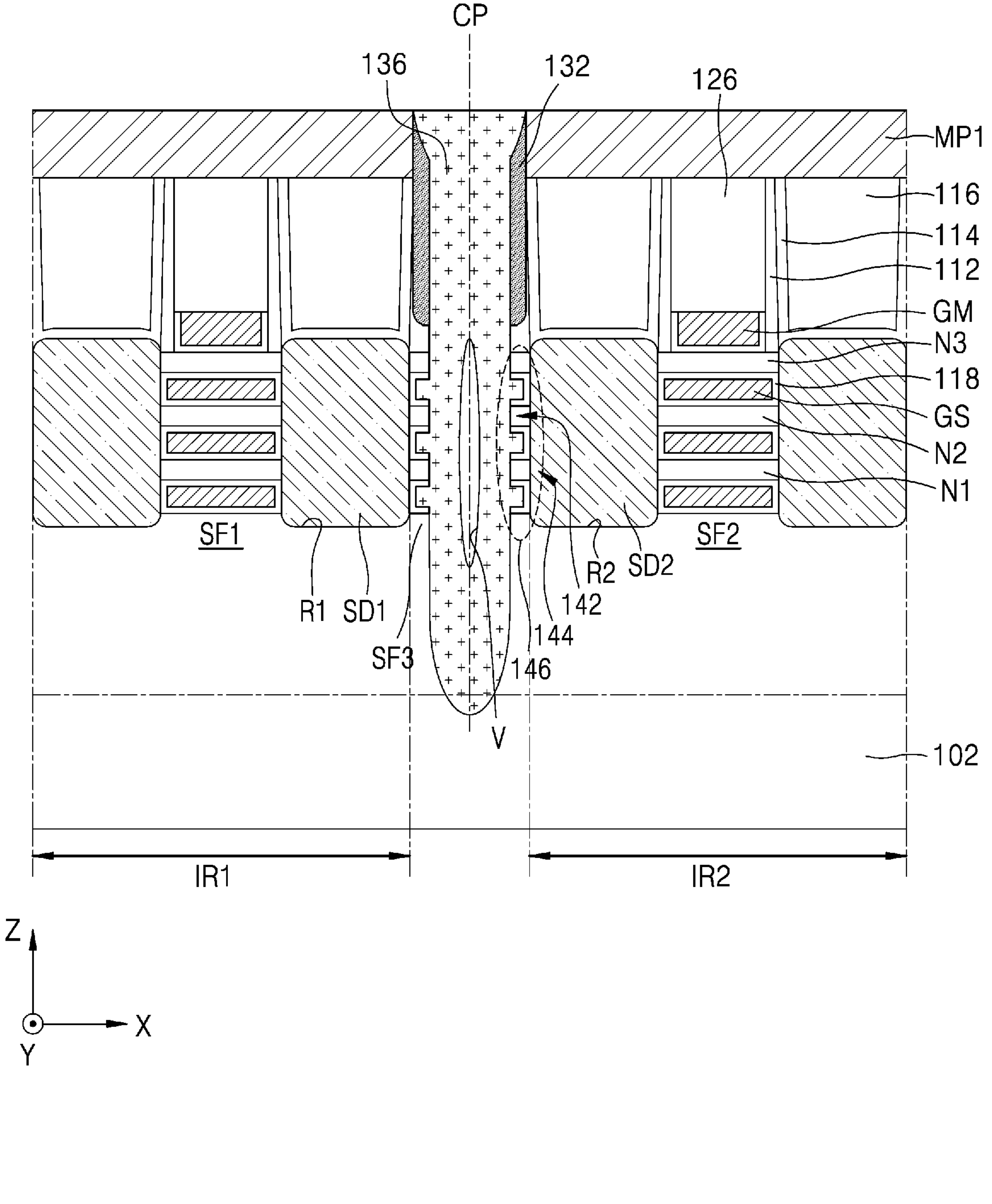
Figure 6K:
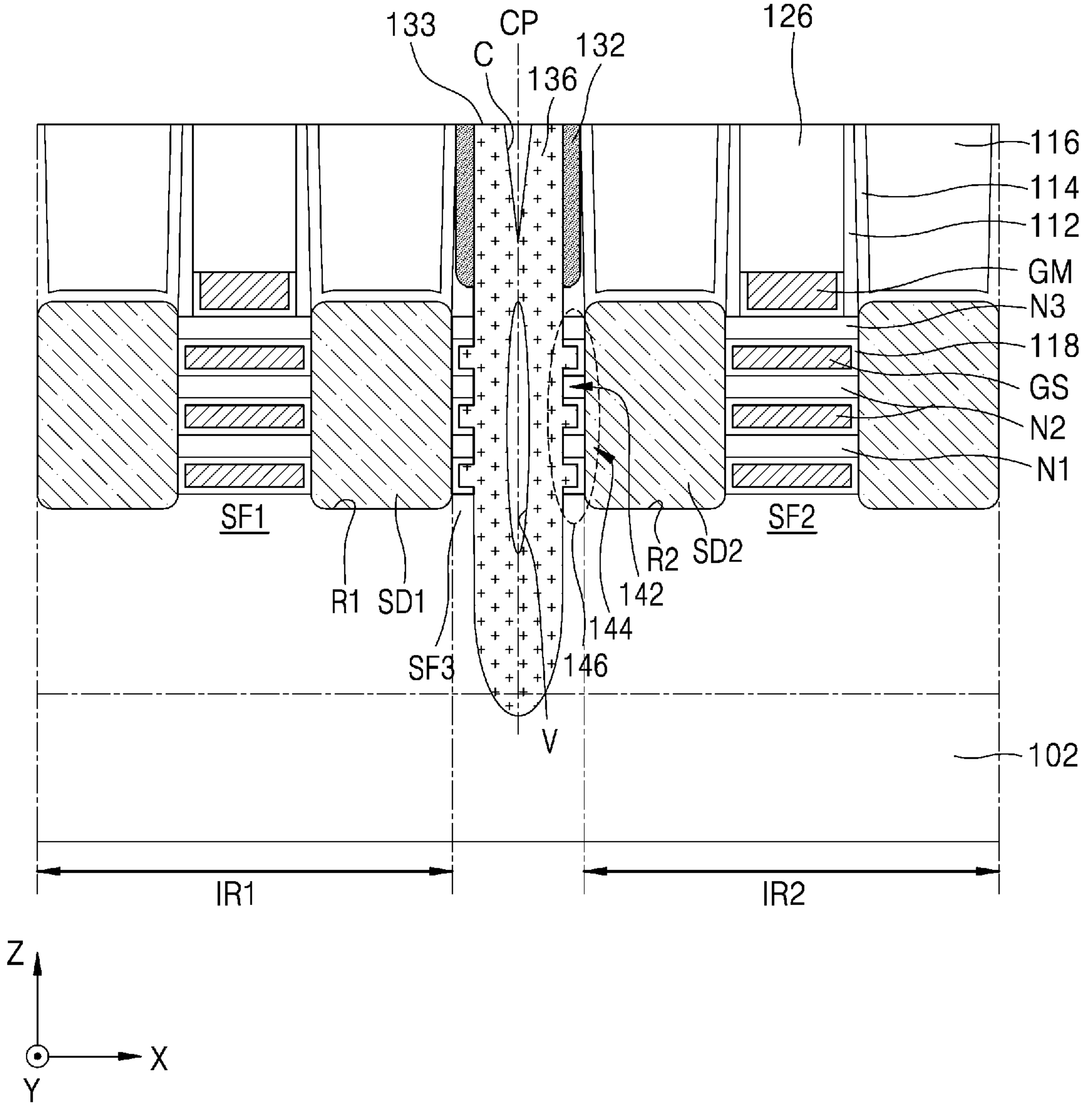

Referring to FIGS. 6J and 6K, a diffusion break plug 136 may be formed to fill the first inner diffusion break gap IG1, and thus, the first diffusion break structure SDB1 may be formed. According to an embodiment of the present inventive concept, the diffusion break plug 136 may be formed using an atomic layer deposition (ALD) process. For example, the diffusion break plug 136 may be formed to conformally and sequentially cover the inside of the first inner diffusion break gap IG1, and a void V may be formed inside a portion of the diffusion break plug 136, which surrounds the indent region 146. Afterwards, the first mask pattern MP1 may be removed by using a planarization process. According to an embodiment of the present inventive concept, an upper portion of the first diffusion break structure SDB1 may be partially removed during the planarization process, and a groove portion C may be formed in a top surface 133 of the diffusion break plug 136.

Figure 6L:
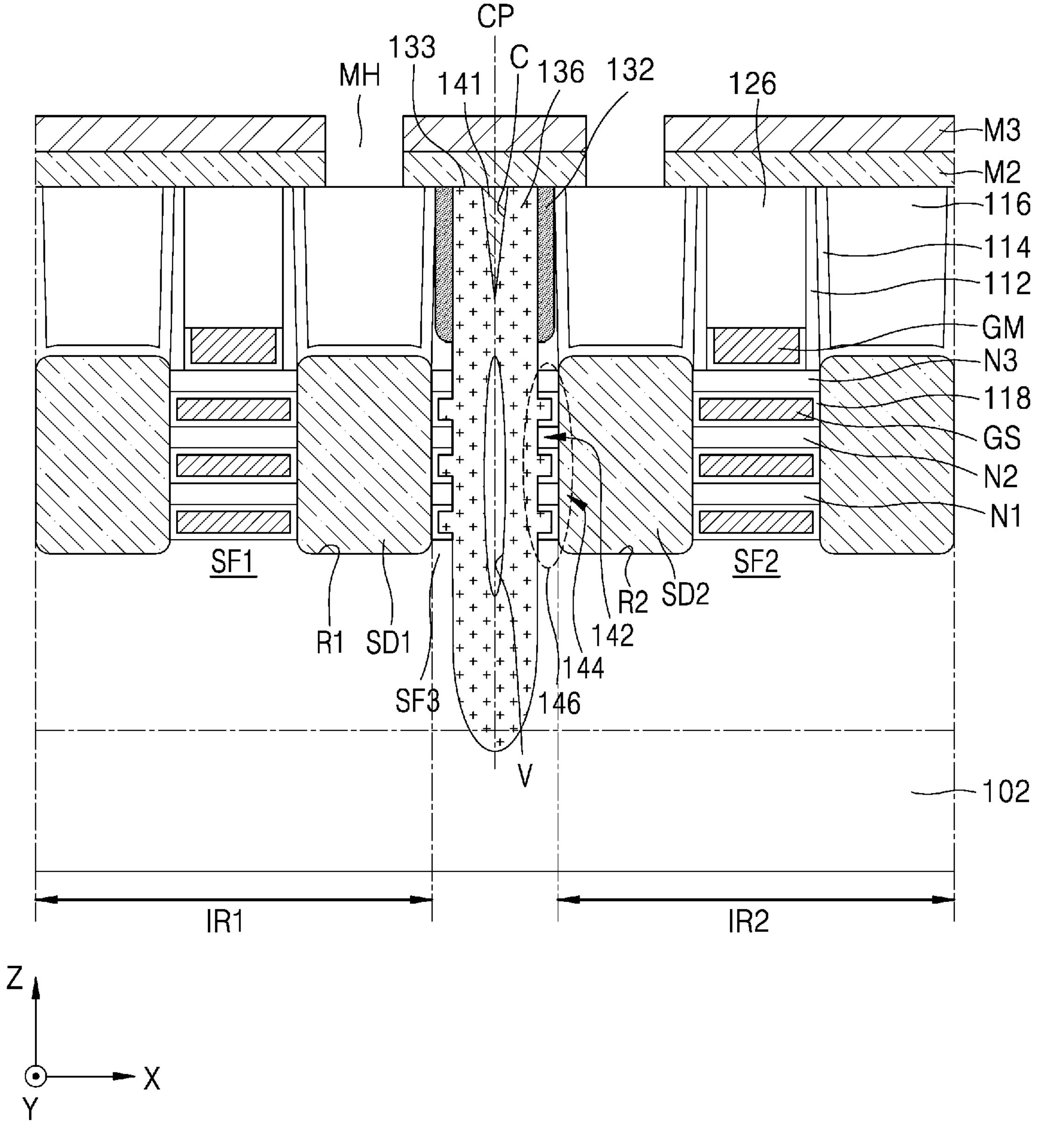
Figure 6M:
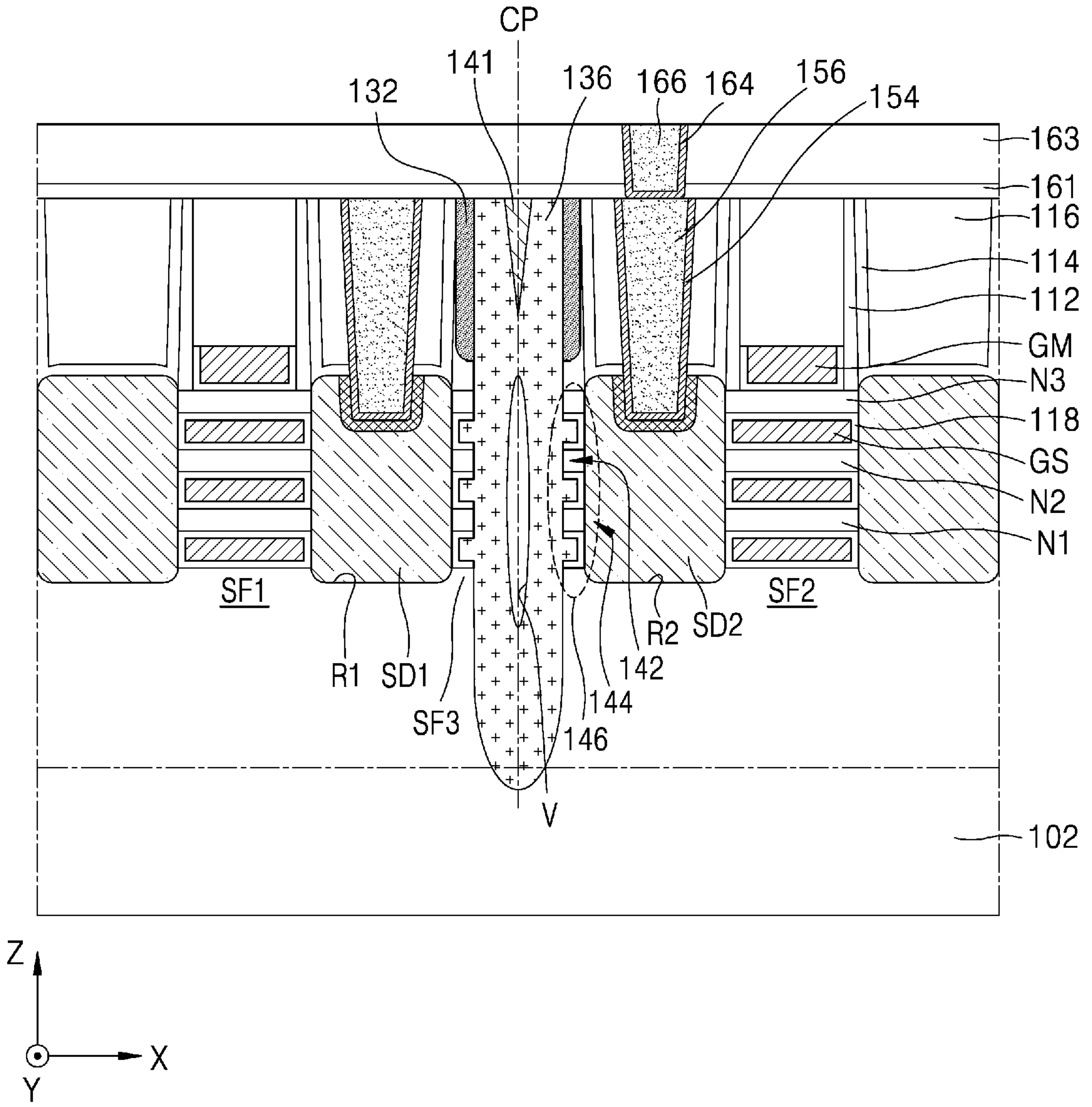

Referring to FIGS. 6K, 6L, and 6M together, a second mask pattern M2 and a third mask pattern M3, each of which have a mask hole MH, may be sequentially disposed on the top surface 133 of the diffusion break plug 136, which is planarized. According to an embodiment of the present inventive concept, the second mask pattern M2 may be formed by using an ALD process, and thus, a composition for forming the second mask pattern M2 may fill the groove portion C.

Thereafter, a metal silicide film 152 and a source/drain contact 153 may be formed by using the mask hole MH. Afterwards, by performing a planarization process, the second and third mask patterns MP2 and MP3 may be removed, and the source/drain contact 153 may be partially removed. According to an embodiment of the present inventive concept, by removing the second and third mask patterns MP2 and MP3, a crack filler 141 may be formed to fill the groove portion C. An etch stop film 161 and an interlayer insulating film 162 may be sequentially stacked on the source/drain contact 153, which is planarized, and a source/drain via contact 163 may be formed.

According to an embodiment of the present inventive concept, by filing the groove portion C with the crack filler 141, structural stability of the first diffusion break structure SDB1 may be increased. For example, in subsequent processes of forming the source/drain contact 153 and a gate contact, the crack filler 141 may prevent the groove portion C from increasing in size or prevent the first diffusion break structure SDB1 from deviating from the outer diffusion break gap OG and the first inner diffusion break gap IG1.

According to an embodiment of the present inventive concept, the second mask pattern M2 and the crack filler 141 may include silicon oxide. According to an embodiment of the present inventive concept, the third mask pattern M3 may include silicon oxide different from that of the second mask pattern M2. For example, the third mask pattern M3 may include tetraethyl orthosilicate (TEOS).

Figure 7A:
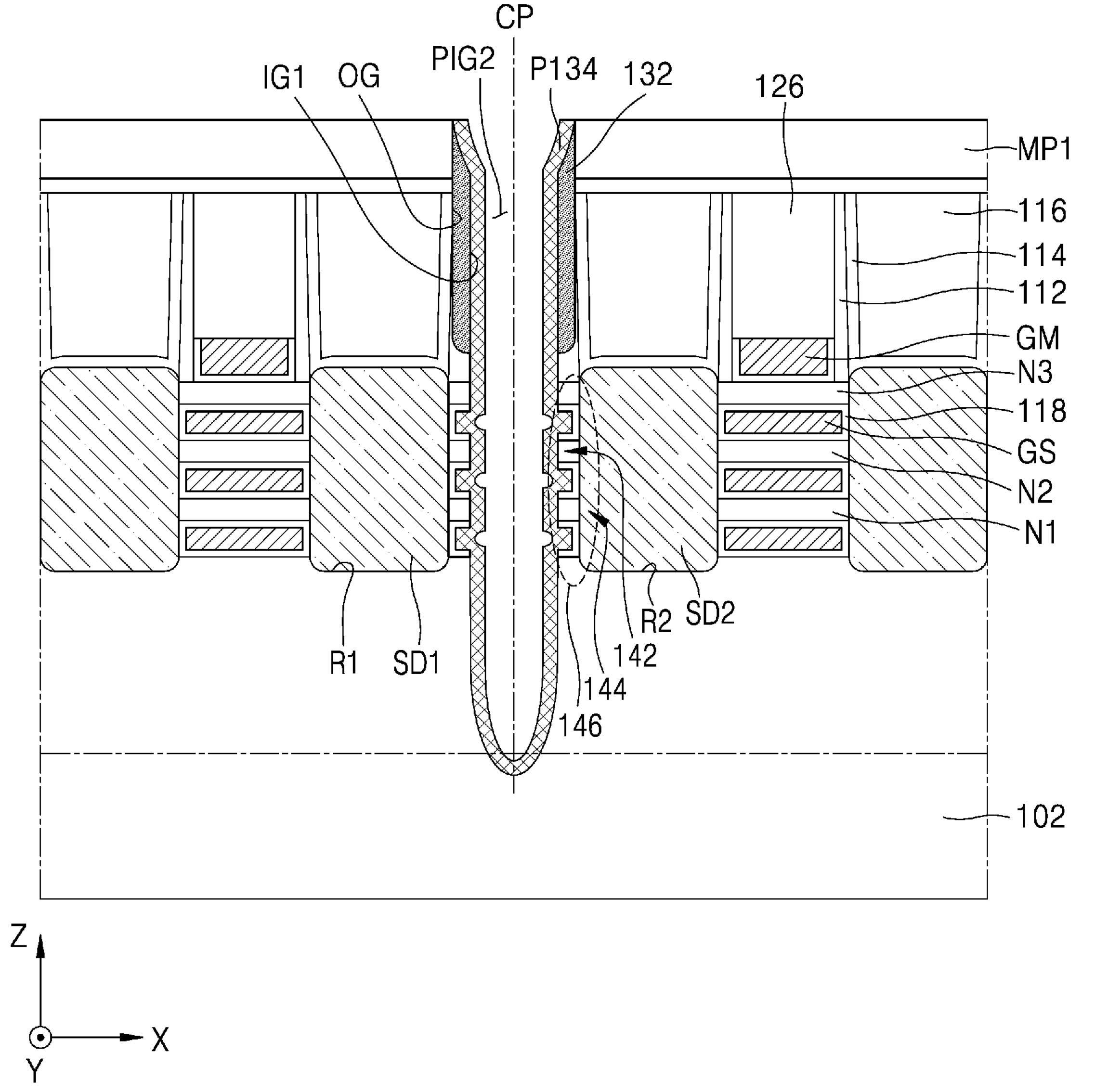
FIGS. 7A and 7B are cross-sectional views corresponding to the cross-sectional view of FIG. 4 to illustrate a method of manufacturing an IC device, according to an embodiment of the present inventive concept.
Figure 7B:
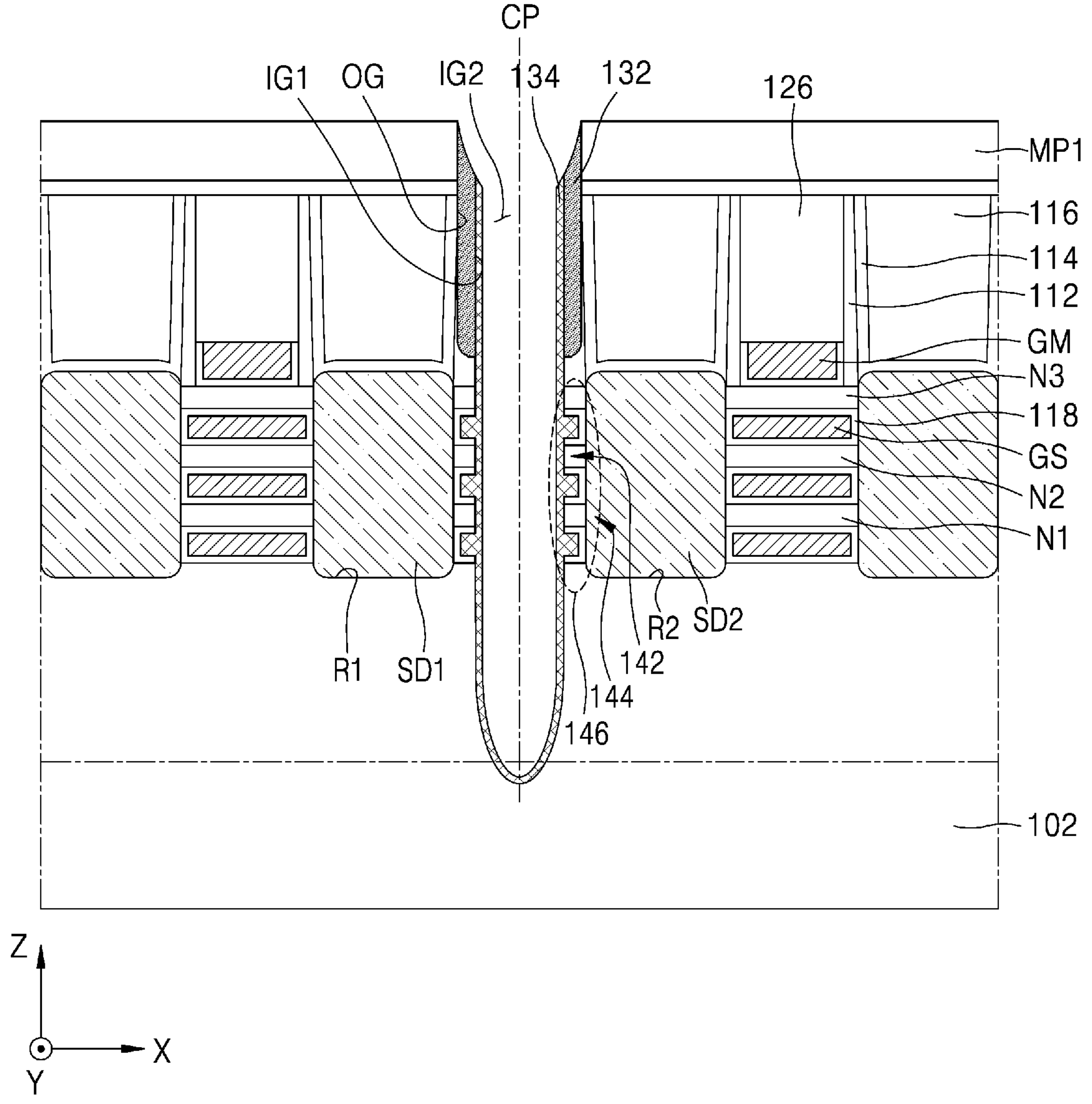

FIGS. 7A and 7B are cross-sectional views corresponding to the cross-sectional view of FIG. 4, which are taken along line X-X' of FIG. 1 to illustrate a method of manufacturing an IC device 100*b*, according to an embodiment of the present inventive concept. FIGS. 7A and 7B illustrate subsequent manufacturing processes after forming a first inner diffusion break gap IG1 according to the process sequence described above with reference to FIGS. 6A to 6I.

Referring to FIGS. 6I, 7A, and 7B together, a preliminary inner liner 134 may be conformally formed inside the first inner diffusion break gap IG1, and a second preliminary inner diffusion break gap PIG2 may be defined by a preliminary inner liner P134. According to an embodiment of the present inventive concept, the preliminary inner liner P134 may fill an outwardly convex portion, with respect to a central plane CP, at a sidewall of the first inner diffusion break gap IG1 defining an indent region 146. According to an embodiment of the present inventive concept, the preliminary inner liner P134 may conformally fill the indent region 146, and a sidewall of the second preliminary inner diffusion break gap PIG2 may have an inwardly concave portion and an outwardly convex portion with respect to the central plane CP.

Thereafter, the inwardly concave portion may be removed by further etching the preliminary inner liner P134 inside the second preliminary inner diffusion break gap PIG2, and an inner liner 134 defining a second inner diffusion break gap IG2 may be formed. According to an embodiment of the present inventive concept, the inner liner 134 may fill the indent region 146 and have a sidewall having a smoother surface (e.g., a substantially even surface) than the preliminary inner liner P134. Thereafter, a diffusion break plug 136 may be formed by using an ALD process to fill the second inner diffusion break gap IG2. The diffusion break plug 136 may include a void V. In an embodiment of the present inventive concept, the diffusion break plug 136 might not include the void V. Subsequently, a process of forming the IC device 100*c* shown in FIG. 5 may be performed.

Subsequently, the IC device 100*b* corresponding to the cross-sectional view of FIG. 4, according to an embodiment of the present inventive concept, may be manufactured by using the same method as the method according to the process sequence shown in FIGS. 6K to 6M.

While the present inventive concept has been described with reference to embodiments thereof, it will be understood by those of ordinary skill in the art that various changes in form and details may be made thereto without departing from the spirit and scope of the present inventive concept.

What is claimed is:

1. An integrated circuit device comprising:

a fin-type active region protruding from a substrate and extending in a first lateral direction, wherein the fin-type active region comprises a first sub-fin-type active region, a second sub-fin-type active region, and a third sub-fin-type active region that is disposed between the first sub-fin-type active region and the second sub-fin-type active region;

a first gate line extending in a second lateral direction on the first sub-fin-type active region, wherein the second lateral direction intersects with the first lateral direction;

a second gate line extending in the second lateral direction on the second sub-fin-type active region;

a diffusion break structure passing through a portion of the third sub-fin-type active region in a vertical direction, wherein the diffusion break structure has a groove portion in an upper portion thereof, wherein the vertical direction is perpendicular both the first lateral direction and the second lateral direction; and a crack filler filling the groove portion.

2. The integrated circuit device of claim 1, wherein the diffusion break structure comprises:

a head portion defining the groove portion in the diffusion break structure;

a body portion comprising a concave portion and a convex portion, wherein the concave portion has a first width in the first lateral direction, wherein the convex portion has a second width in the first lateral direction, wherein the second width is greater than the first width; and a neck portion having a third width in the first lateral direction between the head portion and the body portion, wherein the third width is less than the second width.

3. The integrated circuit device of claim 2, wherein a void is inside the body portion.

4. The integrated circuit device of claim 3, wherein the void is connected to the groove portion.

5. The integrated circuit device of claim 4, wherein the crack filler fills the void.

6. The integrated circuit device of claim 2, wherein the head portion has a fourth width in the first lateral direction, wherein the fourth width is greater than the third width.

7. The integrated circuit device of claim 1, wherein the diffusion break structure has a convex portion and a concave portion to fill an indent region, wherein the diffusion break structure further comprises:

a diffusion break plug passing through a portion of the third sub-fin-type active region in the vertical direction, wherein the diffusion break plug includes the crack filler; and an outer liner partially surrounding the diffusion break plug, wherein the diffusion break plug fills the indent region.

8. The integrated circuit device of claim 7, wherein a void is inside the diffusion break plug.

9. The integrated circuit device of claim 7, further comprising an inner liner at least partially surrounding the diffusion break plug, wherein the inner liner fills the indent region.

10. The integrated circuit device of claim 9, wherein the diffusion break plug has no void.

11. An integrated circuit device comprising:

a substrate comprising a first isolation region and a second isolation region;

a fin-type active region protruding from the substrate, wherein the fin-type active region comprises a first sub-fin-type active region, a second sub-fin-type active region, and a third sub-fin-type active region, wherein the first sub-fin-type active region extends in a first lateral direction in the first isolation region, wherein the second sub-fin-type active region extends in the first lateral direction in the second isolation region, and wherein the third sub-fin-type active region is disposed between the first sub-fin-type active region and the second sub-fin-type active region;

a first gate line extending in a second lateral direction on the first sub-fin-type active region, wherein the second lateral direction intersects with the first lateral direction;

a second gate line extending in the second lateral direction on the second sub-fin-type active region;

a diffusion break structure passing through a portion of the third sub-fin-type active region in a vertical direction between the first isolation region and the second isolation region, wherein the vertical direction is perpendicular both the first lateral direction and the second lateral direction; and a crack filler partially extending from a top surface of the diffusion break structure into the diffusion break structure.

12. The integrated circuit device of claim 11, further comprising:

a plurality of nanosheet stacks disposed on the first sub-fin-type active region and the second sub-fin-type active region; and a dummy nanosheet stack disposed on the third sub-fin-type active region, wherein the dummy nanosheet stack defines an indent region and partially covers a sidewall of the diffusion break structure.

13. The integrated circuit device of claim 12, wherein a void is inside the diffusion break structure, and the void is at substantially a same vertical level as the indent region.

14. The integrated circuit device of claim 13, wherein the crack filler fills the void.

15. The integrated circuit device of claim 13, wherein the crack filler comprises silicon oxide.

16. The integrated circuit device of claim 11, wherein each of the first isolation region and the second isolation region comprises transistors of a same conductivity type as each other.

17. An integrated circuit device comprising:

a substrate comprising a first device region and a second device region, wherein the first device region comprises a first isolation region and a second isolation region;

an inter-region insulating pattern extending in a first lateral direction between the first device region and the second device region;

a first sub-fin-type active region extending in the first lateral direction in the first isolation region;

a second sub-fin-type active region extending in the first lateral direction in the second isolation region;

a third sub-fin-type active region disposed between the first isolation region and the second isolation region;

a first gate line extending in a second lateral direction in the first sub-fin-type active region, wherein the second lateral direction intersects the first lateral direction;

a second gate line extending in the second lateral direction in the second sub-fin-type active region;

a diffusion break structure partially passing through the third sub-fin-type active region, wherein the diffusion break structure has a groove portion, wherein the groove portion partially passes through a top surface of the diffusion break structure in a vertical direction, wherein the vertical direction is perpendicular both the first lateral direction and the second lateral direction;

a first nanosheet stack disposed on the first sub-fin-type active region, wherein the first nanosheet stack is at least partially surrounded by the first gate line;

a second nanosheet stack disposed on the second sub-fin-type active region, wherein the second nanosheet stack is at least partially surrounded by the second gate line;

a dummy nanosheet stack disposed on the third sub-fin-type active region, wherein the dummy nanosheet stack partially covers a sidewall of the diffusion break structure; and a crack filler filling the groove portion of the diffusion break structure.

18. The integrated circuit device of claim 17, wherein a void is inside the diffusion break structure, and the void is at substantially a same vertical level as the dummy nanosheet stack.

19. The integrated circuit device of claim 18, wherein the void is connected to the groove portion, and the crack filler fills the void.

20. The integrated circuit device of claim 17, wherein a top surface of the crack filler is substantially coplanar with the top surface of the diffusion break structure.

* * * * *